(12) United States Patent
Bathwal et al.

(10) Patent No.: US 12,219,386 B2
(45) Date of Patent: Feb. 4, 2025

(54) TRANSMISSION OF PREVIOUSLY COMPRESSED PACKETS TO AVOID THROUGHPUT DROP

(71) Applicant: QUALCOMM Incorporated, San Diego, CA (US)

(72) Inventors: Saket Bathwal, Hyderabad (IN); Gang Andy Xiao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 457 days.

(21) Appl. No.: 17/372,183

(22) Filed: Jul. 9, 2021

(65) Prior Publication Data

US 2023/0009824 A1    Jan. 12, 2023

(51) Int. Cl.
*H04L 9/00*   (2022.01)
*H04L 69/04*  (2022.01)
*H04W 28/06*  (2009.01)

(52) U.S. Cl.
CPC .................................. *H04W 28/06* (2013.01)

(58) Field of Classification Search
None
See application file for complete search history.

(56) References Cited

U.S. PATENT DOCUMENTS

| | | | |
|---|---|---|---|
| 10,958,416 B2* | 3/2021 | Factor | G06F 3/0623 |
| 11,177,825 B2* | 11/2021 | Romanovskii | H03M 7/40 |
| 11,494,320 B2* | 11/2022 | Peffers | G06F 13/1673 |
| 2005/0195750 A1* | 9/2005 | Le | H04L 9/40 |
| | | | 370/252 |
| 2012/0189023 A1* | 7/2012 | Huang | H04L 1/16 |
| | | | 370/477 |
| 2013/0083702 A1* | 4/2013 | Barany | H04W 28/06 |
| | | | 370/329 |
| 2016/0381598 A1* | 12/2016 | Chan | H04L 69/04 |
| | | | 370/474 |
| 2017/0279934 A1* | 9/2017 | Zacharias | H03M 7/6064 |
| 2018/0138921 A1* | 5/2018 | Arelakis | H03M 7/3071 |

FOREIGN PATENT DOCUMENTS

| | | |
|---|---|---|
| WO | 2013001838 A1 | 1/2013 |
| WO | 2021062728 A1 | 4/2021 |

OTHER PUBLICATIONS

International Search Report and Written Opinion—PCT/US2022/034575—ISA/EPO—Sep. 22, 2022.

* cited by examiner

*Primary Examiner* — Sithu Ko
(74) *Attorney, Agent, or Firm* — Procopio, Cory, Hargreaves & Savitch

(57) ABSTRACT

A second wireless device may transmit, to a first wireless device, a feedback message indicative of a transition from a first compression state to a second compression state. The first wireless device may transition, based on a state change indication corresponding to the feedback message, from the first compression state to the second compression state. The first wireless device may transmit, to the second wireless device based on the transition from the first compression state to the second compression state, one or more first data packets that are previously compressed based on the first compression state or one or more second data packets that are uncompressed or recompressed based on the second compression state. The one or more second data packets being associated with the one or more first data packets.

30 Claims, 18 Drawing Sheets

TRANSMISSION OF PREVIOUSLY COMPRESSED PACKETS TO AVOID THROUGHPUT DROP

BACKGROUND

Technical Field

The present disclosure relates generally to communication systems, and more particularly, to data compression in a wireless communication system.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a first (transmitting) wireless device. The apparatus may receive, from a second wireless device, a feedback message indicative of a transition from a first compression state to a second compression state. The apparatus may transition, based on a state change indication corresponding to the feedback message, from the first compression state to the second compression state. The apparatus may transmit, to the second wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets.

In an aspect of the disclosure, a method, a computer-readable medium, and an apparatus are provided. The apparatus may be a second (receiving) wireless device. The apparatus may transmit, to a first wireless device, a feedback message indicative of a transition from a first compression state to a second compression state. The apparatus may receive, from the first wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
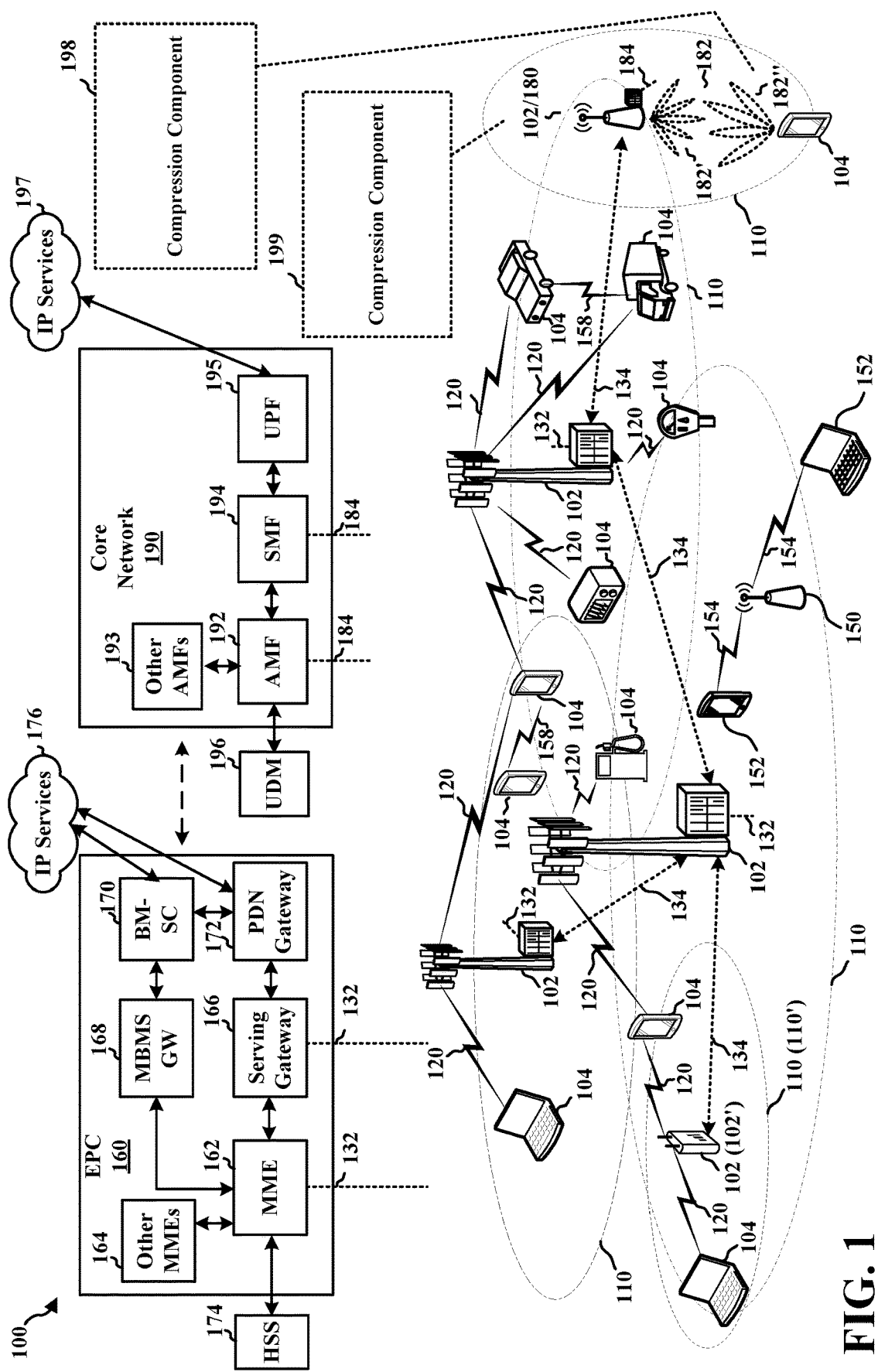
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR4-a or FR4-1, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 may include a compression component 198 that may be configured to receive, from a second wireless device, a feedback message indicative of a transition from a first compression state to a second compression state. The compression component 198 may be configured to transition, based on a state change indication corresponding to the feedback message, from the first compression state to the second compression state. The compression component 198 may be configured to transmit, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets. In certain aspects, the base station 180 may include a compression component 199 that may be configured to transmit, to a first wireless device, a feedback message indicative of a transition from a first compression state to a second compression state. The compression component 199 may be configured to receive, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets. Although the following description may be focused on 5G NR, the concepts described herein may be applicable to other similar areas, such as LTE, LTE-A, CDMA, GSM, and other wireless technologies.

Figure 2:
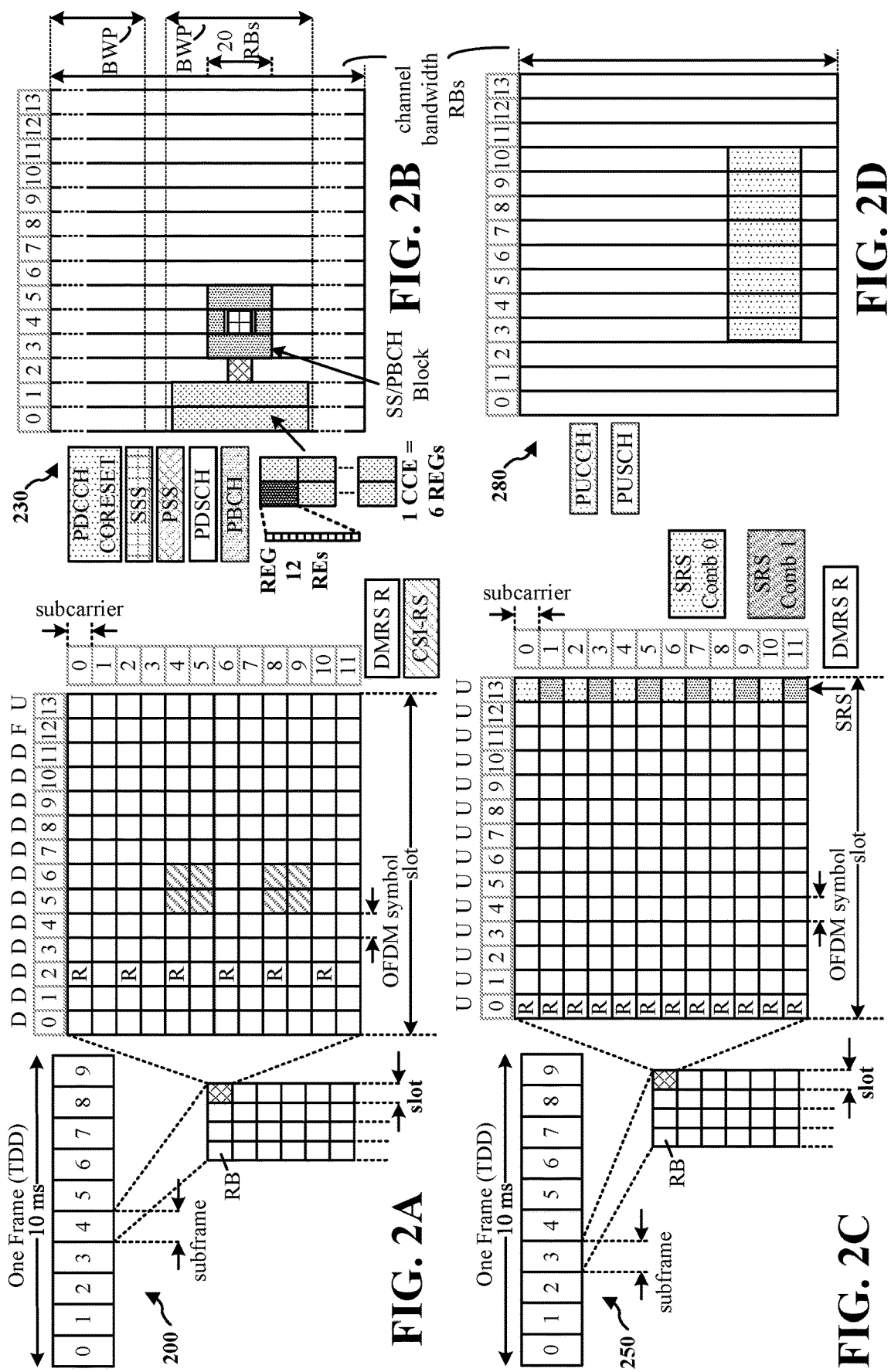
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies μ0 to 4 allow for 1, 2, 4, 8, and 16 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and $2^\mu$ slots/subframe. The subcarrier spacing and symbol length/duration are a function of the numerology. The subcarrier spacing may be equal to $2^\mu*15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
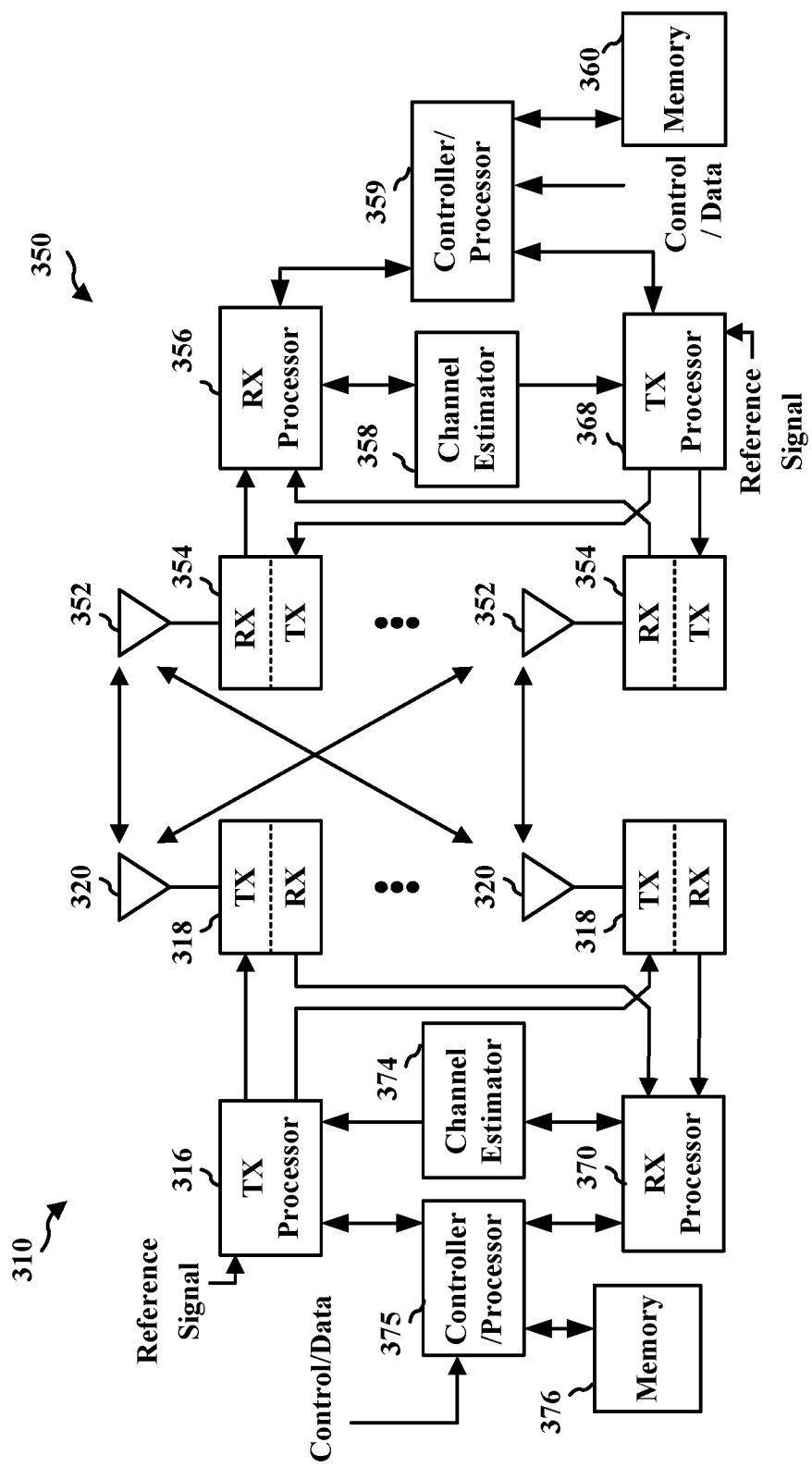
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318 TX. Each transmitter 318 TX may modulate a radio frequency (RF) carrier with a respective spatial stream for transmission.

At the UE 350, each receiver 354 RX receives a signal through its respective antenna 352. Each receiver 354 RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1.

At least one of the TX processor 316, the RX processor 370, and the controller/processor 375 may be configured to perform aspects in connection with 199 of FIG. 1.

Robust header compression (ROHC) is a method to compress internet protocol (IP) packet headers based on different flows and ROHC profiles. ROHC may be applicable to transmission control protocol (TCP) packets, user datagram protocol (UDP) packets, real-time transport protocol (RTP) packets, or internet protocol (IP) packets. The protocol, the IP address, and the source and the destination ports together may define a flow. An ROHC context may be assigned to a flow and may be identified with a context identifier (CID). The ROHC profile 6 may be used to perform header compression for TCP data. TCP packets may be transmitted without any missing sequence. All the TCP packets may be transmitted such that there may not be a decoding failure at the receiver. The transmitter may transmit packets as uncompressed packets even when compression is enabled. In particular, the ROHC bearer may transmit packets as uncompressed on a certain profile, e.g., profile 0.

The ROHC compressor's state machine may be in one of the initialization and refresh (IR) state, the first order (FO) state, or the second order (SO) state. In the IR state, the compressor may have just been created or reset, and full packet headers may be sent. In the FO state, the compressor may have detected and stored the static fields (such as IP addresses and port numbers) on both sides of the connection. The compressor may also send dynamic packet field differences in the FO state. Thus, the FO state may correspond to static and pseudo-dynamic compression. In the SO state, the compressor may suppress all dynamic fields such as RTP sequence numbers, and may send a logical sequence number and a partial checksum to cause the other side to predictively generate and verify the headers of the next expected packet. In general, the FO state may compress all static fields and most dynamic fields. The SO state may compress all dynamic fields predictively using a sequence number and a checksum. Transitions between the states may occur when the compressor compresses a packet that contains too many variations, receives a positive or a negative feedback from the decompressor, or periodically refreshes the context.

When the compressor is in the SO state, if a considerable number of packets are transmitted as uncompressed, the transmitter may transmit in the IR state to refresh the decompressor context.

Figure 4:
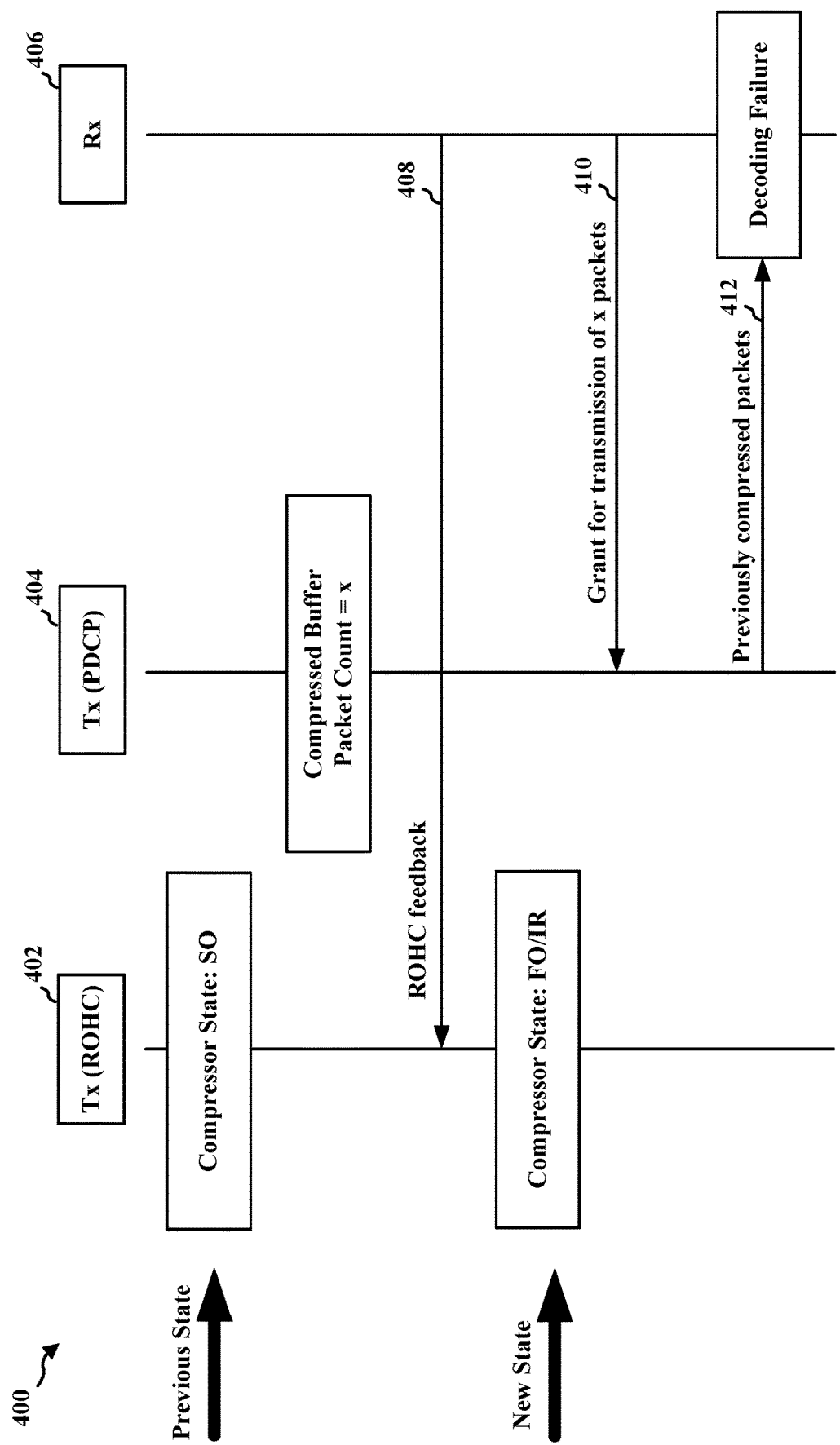
FIG. 4 is a diagram illustrating a potential issue associated with a transition of an ROHC compressor to a lower order state based on a feedback.

FIG. 4 is a diagram 400 illustrating a potential issue associated with a transition of an ROHC compressor to a lower order state based on a feedback. Initially the ROHC compressor 402 at the transmitting device (which may also be referred to as a first (wireless) device hereinafter) (e.g., a UE) may operate in the SO state. A number of packets (e.g., x packets) may have been compressed and stored in the buffer at the PDCP layer 404 of the transmitting device, while the transmitting device may be waiting for an uplink grant from the receiving device 406 (which may also be referred to as a second (wireless) device hereinafter) (e.g., a base station) so that the packets may be transmitted in uplink. Before the transmitting device receives the uplink grant, the ROHC compressor 402 may receive, at 408, an ROHC feedback from the receiving device 406. The ROHC feedback (e.g., a negative feedback) may indicate a transition to a lower order compression state, for example, from the SO state to the FO or the IR state.

Because the compressed x packets have been compressed with the ROHC compressor 402 in the higher order state (e.g., the SO state), transmitting these previously compressed packets, at 412, to the receiving device 406 after the grant at 410 may result in a decoding failure at the receiving device 406. The decoding failure may in turn lead to a drop in data throughput.

Figure 5:
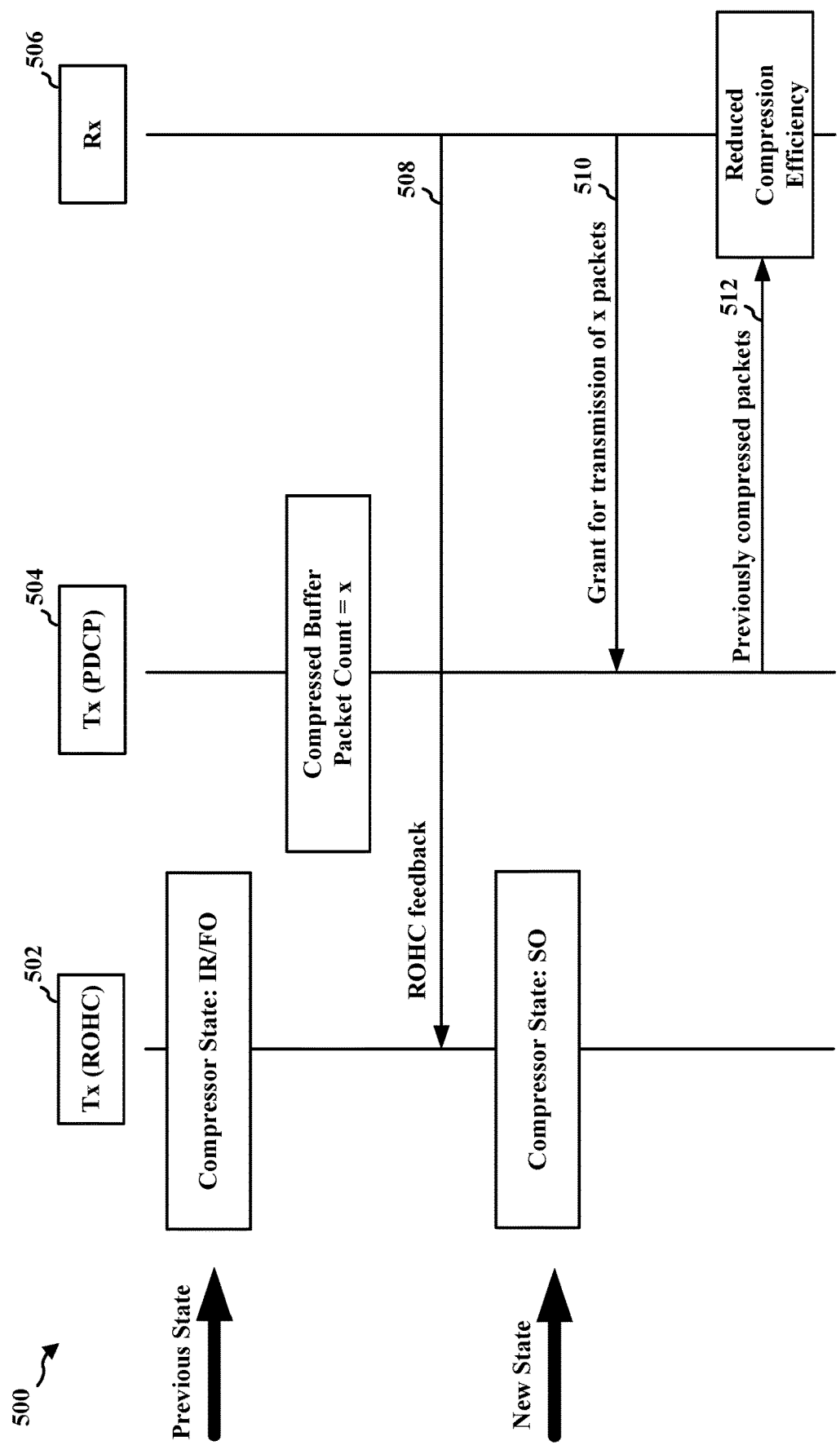
FIG. 5 is a diagram illustrating a potential issue associated with a transition of an ROHC compressor to a higher order state based on a feedback.

FIG. 5 is a diagram 500 illustrating a potential issue associated with a transition of an ROHC compressor to a higher order state based on a feedback. Initially the ROHC compressor 502 at the transmitting device may operate in the IR or the FO state. A number of packets (e.g., x packets) may have been compressed and stored in the buffer at the PDCP layer 504 of the transmitting device, while the transmitting device may be waiting for an uplink grant from the receiving device 506 so that the packets may be transmitted in uplink. Before the transmitting device receives the uplink grant, the ROHC compressor 502 may receive, at 508, an ROHC feedback from the receiving device 506. The ROHC feedback (e.g., a positive feedback) may indicate a transition to a higher order compression state, for example, from the IR or the FO state to the SO state.

Because the compressed x packets have been compressed with the ROHC compressor 502 in the lower order state (e.g., the IR or the FO state), transmitting these previously compressed packets, at 512, to the receiving device 506 after the grant at 510 may result in a reduced compression efficiency as higher order compression could have been used. The reduced compression efficiency may correspond to a waste of bandwidth resources and transmit power.

Figure 6:
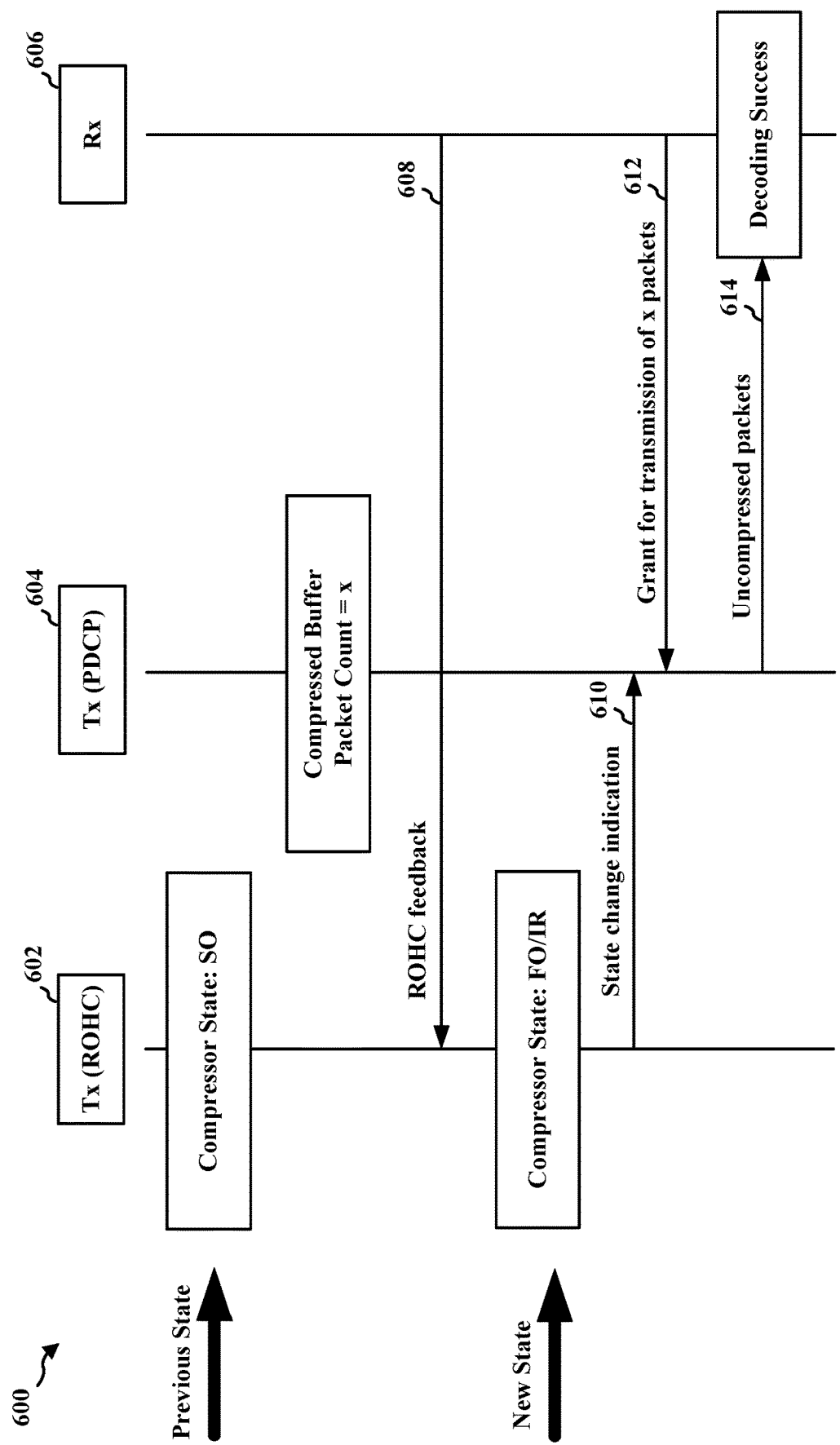
FIG. 6 is a communication flow diagram of a method of wireless communication.

FIG. 6 is a communication flow diagram 600 of a method of wireless communication. FIG. 6 illustrates initial events that may be similar to those illustrated in FIG. 4. Initially the ROHC compressor 602 at the transmitting device may operate in the SO state. A number of packets (e.g., x packets) may have been compressed and stored in the buffer at the PDCP layer 604 of the transmitting device, while the transmitting device may be waiting for an uplink grant from the receiving device 606 so that the packets may be transmitted in uplink. Before the transmitting device receives the uplink grant, the ROHC compressor 602 may receive, at 608, an ROHC feedback from the receiving device 606. The ROHC feedback (e.g., a negative feedback) may indicate a transition to a lower order compression state, for example, from the SO state to the FO or the IR state.

At 610, the ROHC compressor 602 may provide a state change indication to the PDCP layer 604 of the transmitting device. Based on the state change indication, the entire set of the unsent x previously compressed packets may be discarded, and the corresponding uncompressed packets may be transmitted, at 614, instead to the receiving device 606 after the grant at 612. As the ROHC bearer may already have a context established for profile 0 for uncompressed packets, there may not be a decoding failure at the receiver. Once all the packets are transmitted as uncompressed packets, the transmitting device may restart with the IR state for all the CIDs to avoid further decompression/decoding failures. This may have a negative impact on compression efficiency but not on performance (e.g., in terms of million instructions per second "MIPS"). It should be appreciated that when there are multiple CIDs corresponding to multiple flows on a compressed bearer, all the CIDs may be forced to transmit uncompressed packets. As a result, compression efficiency may be reduced.

Figure 7:
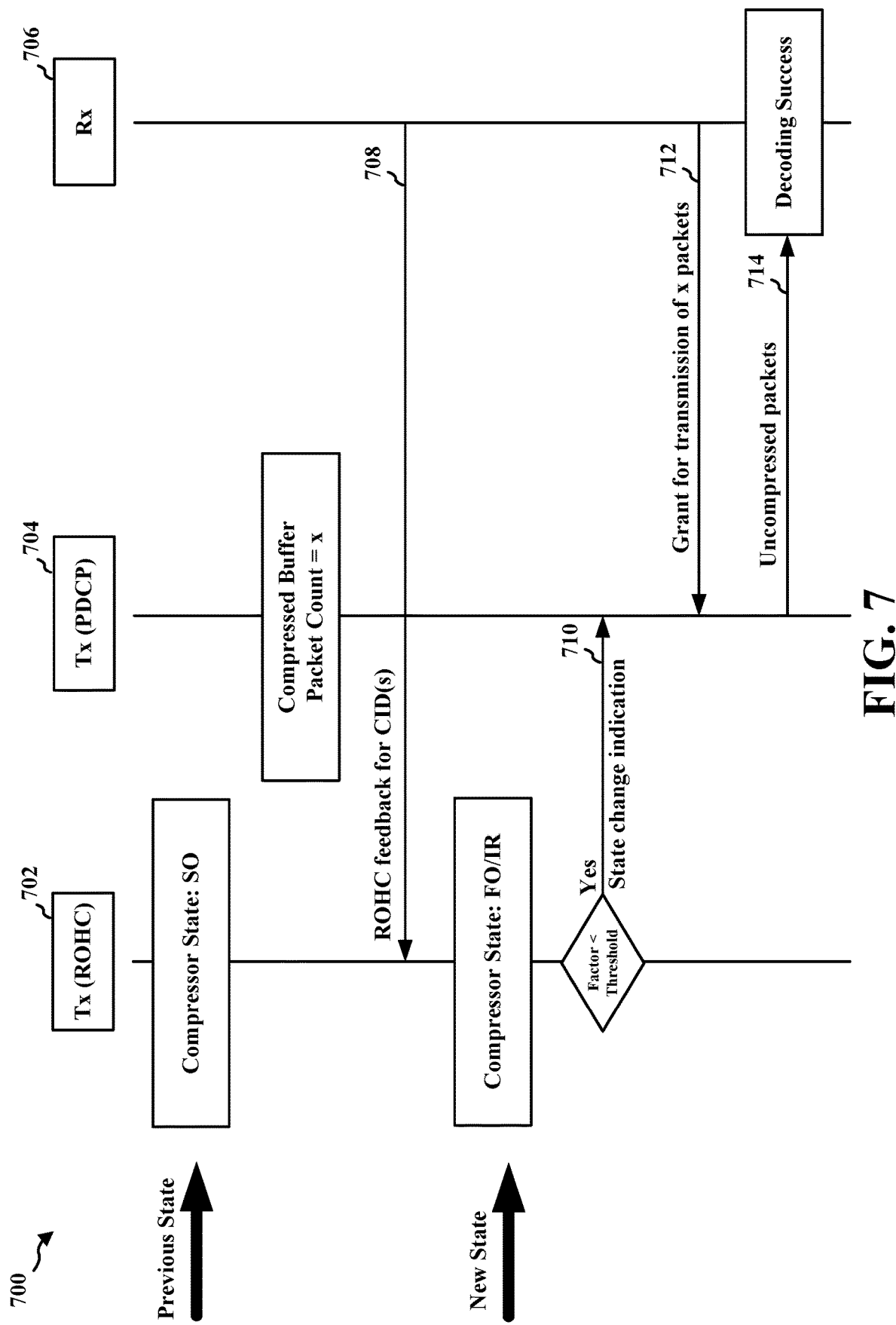
FIG. 7 is a communication flow diagram of a method of wireless communication.

FIG. 7 is a communication flow diagram 700 of a method of wireless communication. FIG. 7 illustrates initial events that may be similar to those illustrated in FIG. 4. Initially the ROHC compressor 702 at the transmitting device may operate in the SO state. A number of packets (e.g., x packets) may have been compressed and stored in the buffer at the PDCP layer 704 of the transmitting device, while the transmitting device may be waiting for an uplink grant from the receiving device 706 so that the packets may be transmitted in uplink. Before the transmitting device receives the uplink grant, the ROHC compressor 702 may receive, at 708, an ROHC feedback for one or more CIDs from the receiving device 706. The ROHC feedback (e.g., a negative feedback) for one or more CIDs may indicate a transition to a lower order compression state, for example, from the SO state to the FO or the IR state.

Whether to transmit the previously compressed packets as uncompressed packets may be determined based on a comparison between a factor and a threshold. The factor may be calculated as the total number of previously compressed bytes divided by (/) the number of previously compressed bytes associated with the one or more CIDs associated with the ROHC feedback. If the factor is less than the threshold, at 710, the ROHC compressor 702 may provide a state change indication to the PDCP layer 704 of the transmitting device. Based on the state change indication, the entire set of the unsent x previously compressed packets may be discarded, and the corresponding uncompressed packets may be transmitted, at 714, to the receiving device 706 instead after the grant at 712. If the factor is greater than the threshold, the previously compressed packets may be transmitted to the receiving device 706 in an unaltered state (i.e., as previously compressed packets with no change). It should be appreciated that there may be added overall overhead associated with making the decision on whether to transmit the packets as uncompressed packets.

Figure 8:
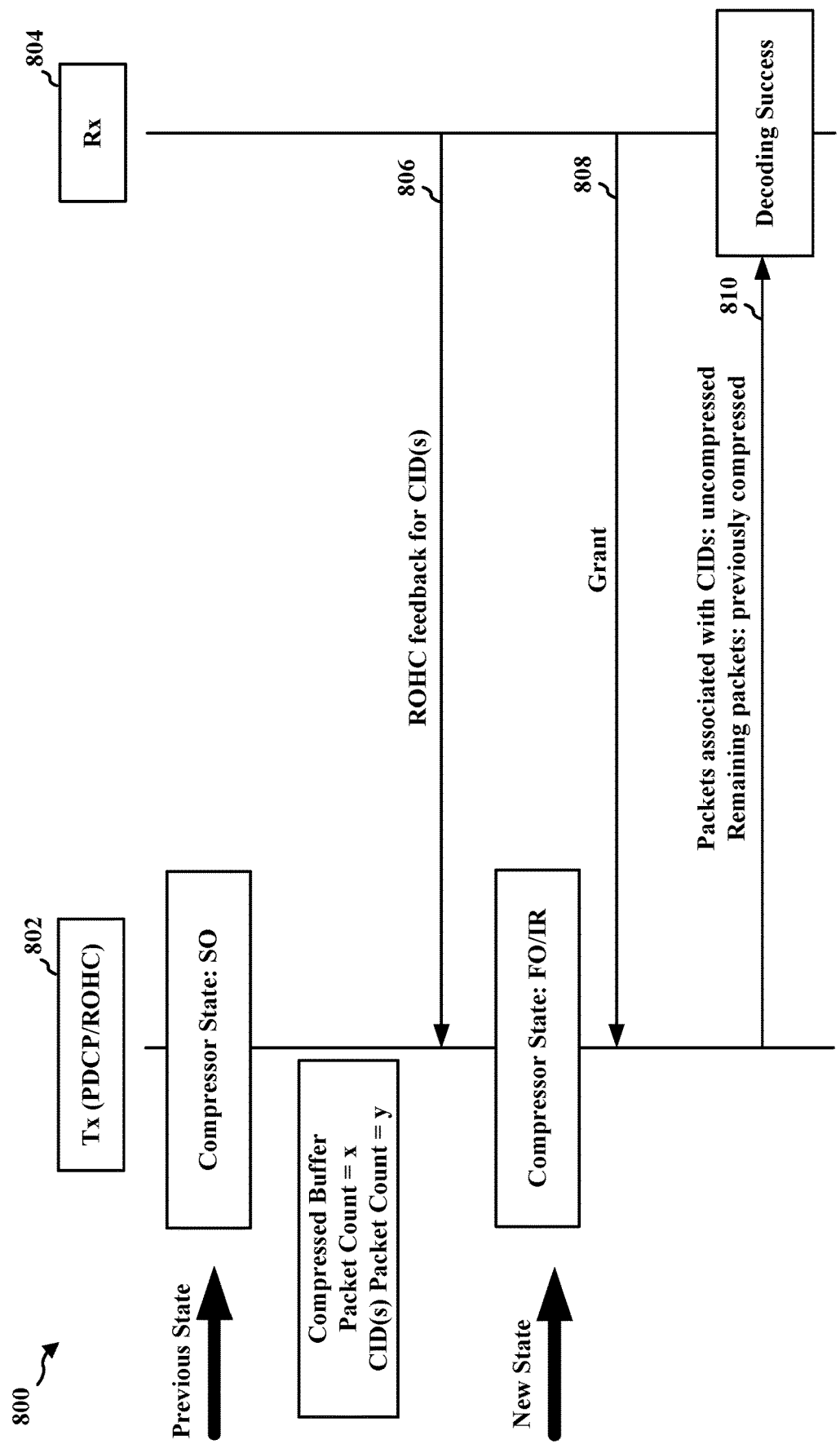
FIG. 8 is a communication flow diagram of a method of wireless communication.

FIG. 8 is a communication flow diagram 800 of a method of wireless communication. FIG. 8 illustrates initial events that may be similar to those illustrated in FIG. 4. Initially the ROHC compressor at the transmitting device 802 may operate in the SO state. A number of packets (e.g., x packets) may have been compressed and stored in the buffer at the PDCP layer of the transmitting device 802, while the transmitting device 802 may be waiting for an uplink grant from the receiving device 804 so that the packets may be transmitted in uplink. Before the transmitting device 802 receives the uplink grant, the transmitting device 802 may receive, at 806, an ROHC feedback for one or more CIDs from the receiving device 804. The ROHC feedback (e.g., a negative feedback) for one or more CIDs may indicate a transition to a lower order compression state, for example, from the SO state to the FO or the IR state.

At 810, after the grant at 808, the transmitting device 802 may discard the previously compressed y packets associated with the one or more CIDs associated with the ROHC feedback, and may transmit corresponding uncompressed packets to the receiving device 804 instead. Further, the transmitting device 802 may transmit the remaining previously compressed packets to the receiving device 804 in an unaltered state (i.e., as previously compressed packets with no change).

Figure 9:
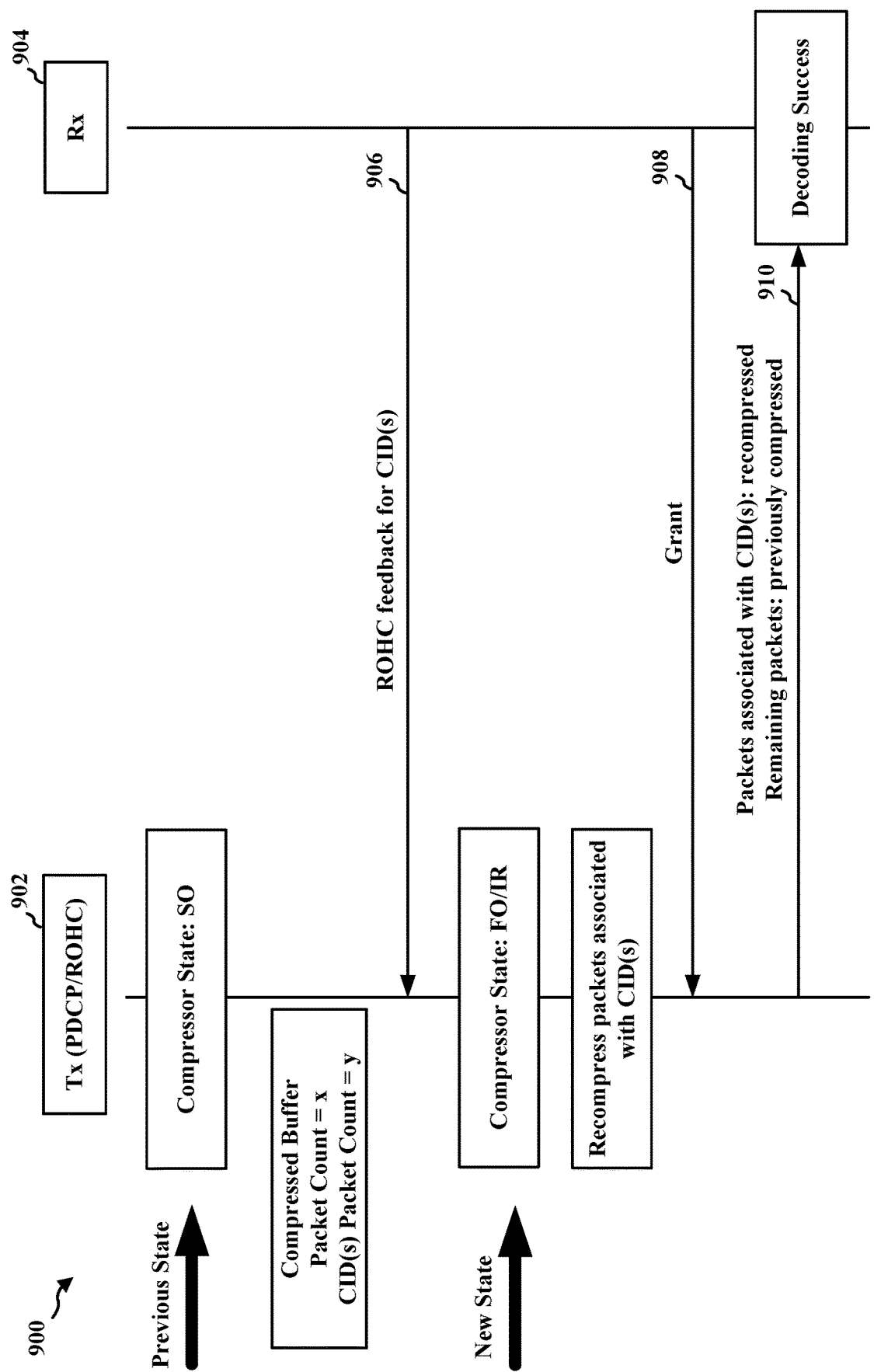
FIG. 9 is a communication flow diagram of a method of wireless communication.

FIG. 9 is a communication flow diagram 900 of a method of wireless communication. FIG. 9 illustrates initial events that may be similar to those illustrated in FIG. 4. Initially the ROHC compressor at the transmitting device 902 may operate in the SO state. A number of packets (e.g., x packets) may have been compressed and stored in the buffer at the PDCP layer of the transmitting device 902, while the transmitting device 902 may be waiting for an uplink grant from the receiving device 904 so that the packets may be transmitted in uplink. Before the transmitting device 902 receives the uplink grant, the transmitting device 902 may receive, at 906, an ROHC feedback for one or more CIDs from the receiving device 904. The ROHC feedback (e.g., a negative feedback) for one or more CIDs may indicate a transition to a lower order compression state, for example, from the SO state to the FO or the IR state.

The transmitting device 902, and the ROHC compressor in particular, may recompress the packets associated with the one or more CIDs associated with the ROHC feedback based on the new lower order compression state. Thereafter, at 910, after the grant at 908, the transmitting device 902 may transmit the recompressed packets associated with the one or more CIDs associated with the ROHC feedback to the receiving device 904. Further, the transmitting device 902 may transmit the remaining previously compressed packets to the receiving device 904 in an unaltered state (i.e., as previously compressed packets with no change). It should be appreciated that when there are a large number of compressed packets, recompressing all the packets may have a slight performance impact, but the overall compression efficiency may be improved.

Figure 10:
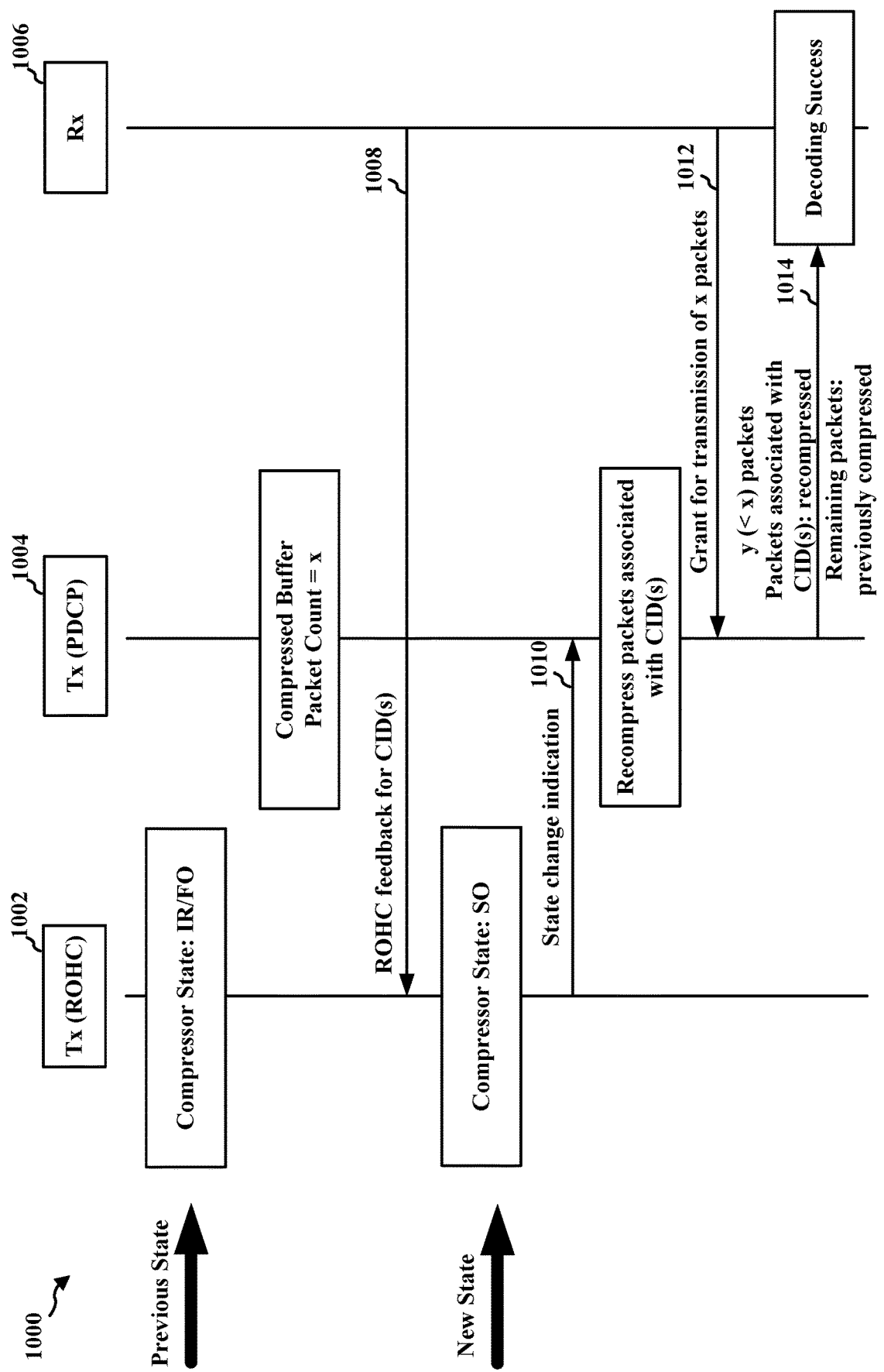
FIG. 10 is a communication flow diagram of a method of wireless communication.

FIG. 10 is a communication flow diagram 1000 of a method of wireless communication. FIG. 10 illustrates initial events that may be similar to those illustrated in FIG. 5. Initially the ROHC compressor 1002 at the transmitting device may operate in the IR or the FO state. A number of packets (e.g., x packets) may have been compressed and stored in the buffer at the PDCP layer 1004 of the transmitting device, while the transmitting device may be waiting for an uplink grant from the receiving device 1006 so that the packets may be transmitted in uplink. Before the transmitting device receives the uplink grant, the ROHC compressor 1002 may receive, at 1008, an ROHC feedback for one or more CIDs from the receiving device 1006. The ROHC feedback (e.g., a positive feedback) for one or more CIDs may indicate a transition to a higher order compression state, for example, from the IR or the FO state to the SO state.

At 1010, the ROHC compressor 1002 may provide a state change indication to the PDCP layer 1004 of the transmitting device. Based on the state change indication, the PDCP layer 1004 of the transmitting device may recompress the packets associated with the one or more CIDs associated with the ROHC feedback based on the new higher order compression state. Thereafter, at 1014, after the grant for transmission of x packets at 1012, the transmitting device may transmit the recompressed packets associated with the one or more CIDs associated with the ROHC feedback to the receiving device 1006. Further, the transmitting device may transmit the remaining previously compressed packets to the receiving device 1006 in an unaltered state (i.e., as previously compressed packets with no change). As the packets associated with the CIDs associated with the ROHC feedback are recompressed based on a higher order compression state, a fewer total number (e.g., y) of packets may be transmitted at 1014, and the grant for x packets at 1012 may accommodate the whole transmission at 1014. It should be appreciated that when there are a large number of compressed packets, recompressing all the packets may have a slight performance impact, but the transmitting device (e.g., a UE) may save considerable transmit power and uplink resources.

Figure 11:
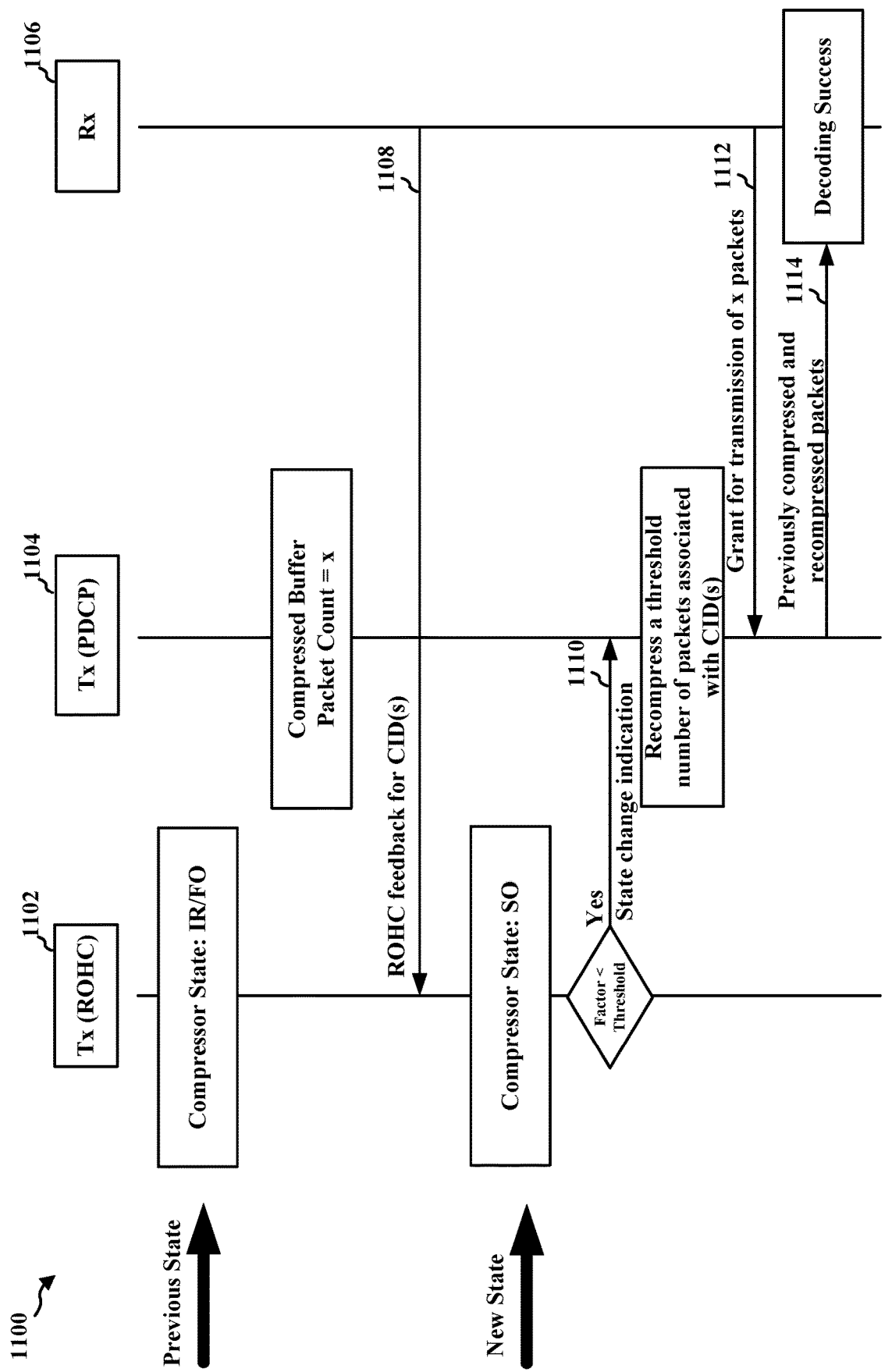
FIG. 11 is a communication flow diagram of a method of wireless communication.

FIG. 11 is a communication flow diagram 1100 of a method of wireless communication. FIG. 11 illustrates initial events that may be similar to those illustrated in FIG. 5. Initially the ROHC compressor 1102 at the transmitting device may operate in the IR or the FO state. A number of packets (e.g., x packets) may have been compressed and stored in the buffer at the PDCP layer 1104 of the transmitting device, while the transmitting device may be waiting for an uplink grant from the receiving device 1106 so that the packets may be transmitted in uplink. Before the transmitting device receives the uplink grant, the ROHC compressor 1102 may receive, at 1108, an ROHC feedback for one or more CIDs from the receiving device 1106. The ROHC feedback (e.g., a positive feedback) for one or more CIDs may indicate a transition to a higher order compression state, for example, from the IR or the FO state to the SO state.

Whether to recompress the previously compressed packets based on the new higher order compression state may be determined based on a comparison between a factor and a threshold. The factor may be calculated as the total number of previously compressed bytes divided by (/) the number of previously compressed bytes associated with the one or more CIDs associated with the ROHC feedback. If the factor is less than the threshold, at 1110, the ROHC compressor 1102 may provide a state change indication to the PDCP layer 1104 of the transmitting device. Based on the state change indication, the PDCP layer 1104 of the transmitting device may recompress a subset of previously compressed packets associated with the one or more CIDs associated with the ROHC feedback based on the new higher order compression state. The number of packets in the recompressed subset of packets may be based on the threshold. After the grant at 1112, the PDCP layer 1104 of the transmitting device may transmit, at 1114, the recompressed subset of packets associated with the one or more CIDs associated with the ROHC feedback to the receiving device 1106, and may transmit the remaining previously compressed packets to the receiving device 1106 in an unaltered state (i.e., as previously compressed packets with no change). If the factor is greater than the threshold, the entire set of previously compressed packets may be transmitted to the receiving device 706 in an unaltered state (i.e., as previously compressed packets with no change). It should be appreciated that there may be added overhead associated with making the decision on whether to recompress a subset of previously compressed packets.

Different solutions and aspects described herein may be associated with different overall performance profiles that include different compression efficiencies, different bandwidth resource utilizations, and/or different transmit power savings. Although ROHC is used hereinafter as an example of a compression protocol, aspects may be adapted for other compression methods, such as uplink data compression (UDC), as well.

Figure 12:
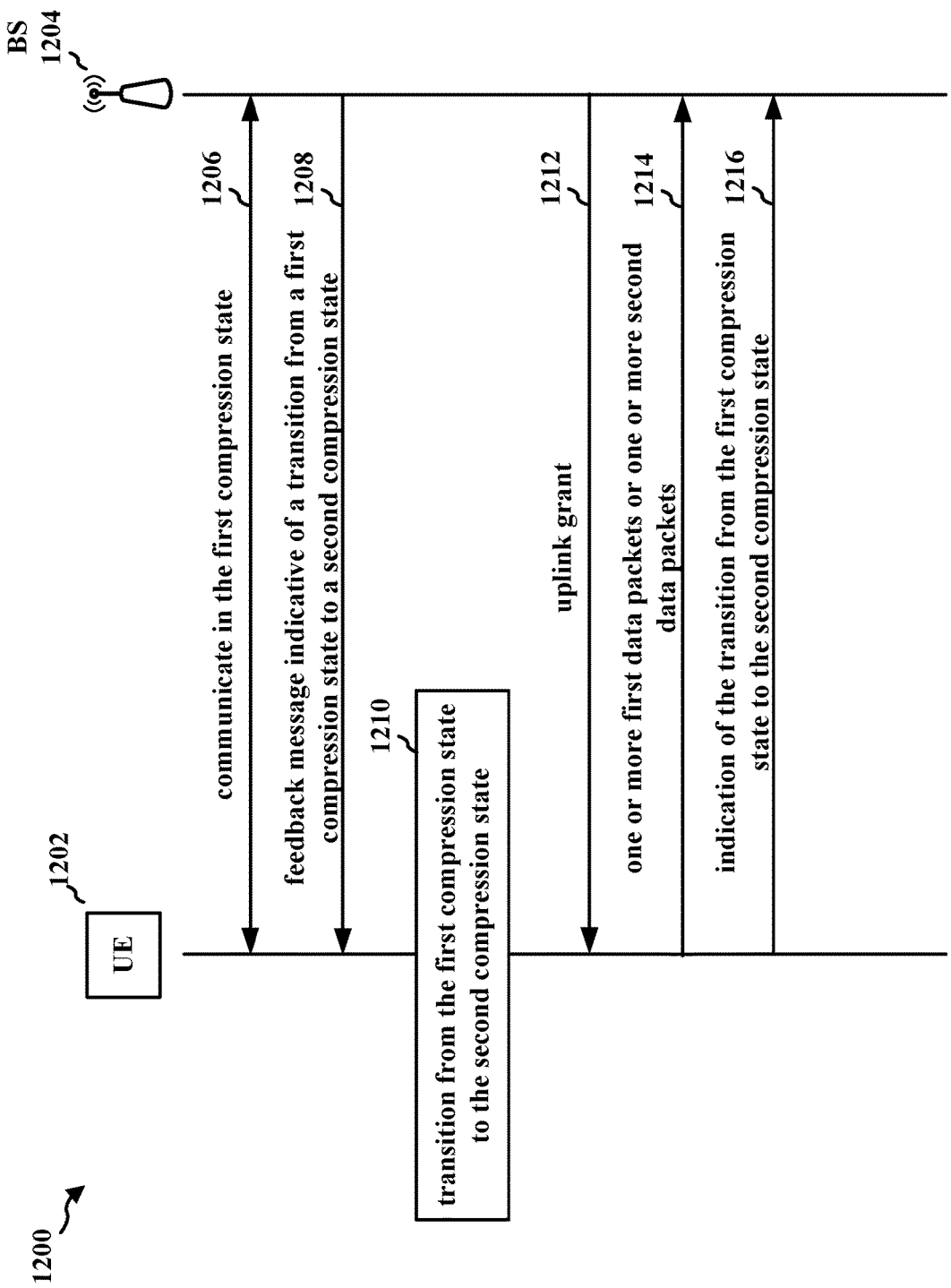
FIG. 12 is a communication flow diagram of a method of wireless communication.

FIG. 12 is a communication flow diagram 1200 of a method of wireless communication. The UE 1202 may also be referred to herein as a first device 1202, and the base station 1204 may also be referred to herein as a second device 1204. In other aspects, the roles of the UE and the base station may be reversed. At 1206, the first device 1202 and the second device 1204 may communicate with each other in the first compression state. At 1208, the second device 1204 may transmit to the first device 1202, and the first device 1202 may receive from the second device 1204, a feedback message indicative of a transition from a first compression state to a second compression state. At 1210, the first device 1202 may transition, based on a state change indication corresponding to the feedback message, from the first compression state to the second compression state. At 1212, the second device 1204 may transmit to the first device 1202, and the first device 1202 may receive from the second device 1204 an uplink grant for a transmission of a number of data packets. At 1214, the first device 1202 may transmit to the second device 1204, and the second device 1204 may receive from the first device 1202, based on the transition from the first compression state to the second compression state, one or more first data packets that are previously compressed based on the first compression state or one or more second data packets that are uncompressed or recompressed based on the second compression state, the one or more second data packets being associated with the one or more first data packets. At 1216, the first device 1202 may transmit to the second device 1204, and the second device 1204 may receive from the first device 1202, an indication of the transition from the first compression state to the second compression state.

In one configuration, the one or more first data packets or the one or more second data packets may correspond to at least one of: TCP packets, UDP packets, RTP packets, or IP packets.

In one configuration, the feedback message may be associated with one or more CIDs. The one or more first data packets or the one or more second data packets may correspond to buffered data packets associated with the one or more CIDs. The first device 1202 may transmit at 1214 the one or more second data packets to the second device 1204 as data packets recompressed based on the second compression state.

In one configuration, the first compression state (e.g., the SO state) may be associated with a higher order than the second compression state (e.g., the IR or the FO state).

In one configuration, the one or more first data packets or the one or more second data packets may correspond to an entire set of buffered data packets. The first device 1202 may transmit at 1214 the one or more second data packets to the second device 1204 as uncompressed data packets.

In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to an entire set of buffered data packets. The first device 1202 may transmit at 1214 the one or more second data packets to the second device 1204 as uncompressed data packets when the factor is less than a threshold, and the first device 1202 may transmit at 1214 the one or more first data packets to the second device 1204 when the factor is greater than the threshold.

In one configuration, the feedback message may be associated with one or more CIDs. The one or more first data packets or the one or more second data packets may correspond to buffered data packets associated with the one or more CIDs. The first device 1202 may transmit at 1214 the one or more second data packets to the second device 1204 as uncompressed data packets.

In one configuration, the second compression state (e.g., the SO state) may be associated with a higher order than the first compression state (e.g., the IR or the FO state).

In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to a subset of buffered data packets associated with the one or more CIDs. A number of data packets in the subset may be based on the factor. The first device 1202 may transmit at 1214 the one or more second data packets to the second device 1204 as data packets recompressed based on the second compression state when the factor is less than a threshold, and the first device 1202 may transmit at 1214 the one or more first data packets to the second device 1204 when the factor is greater than the threshold.

Figure 13:
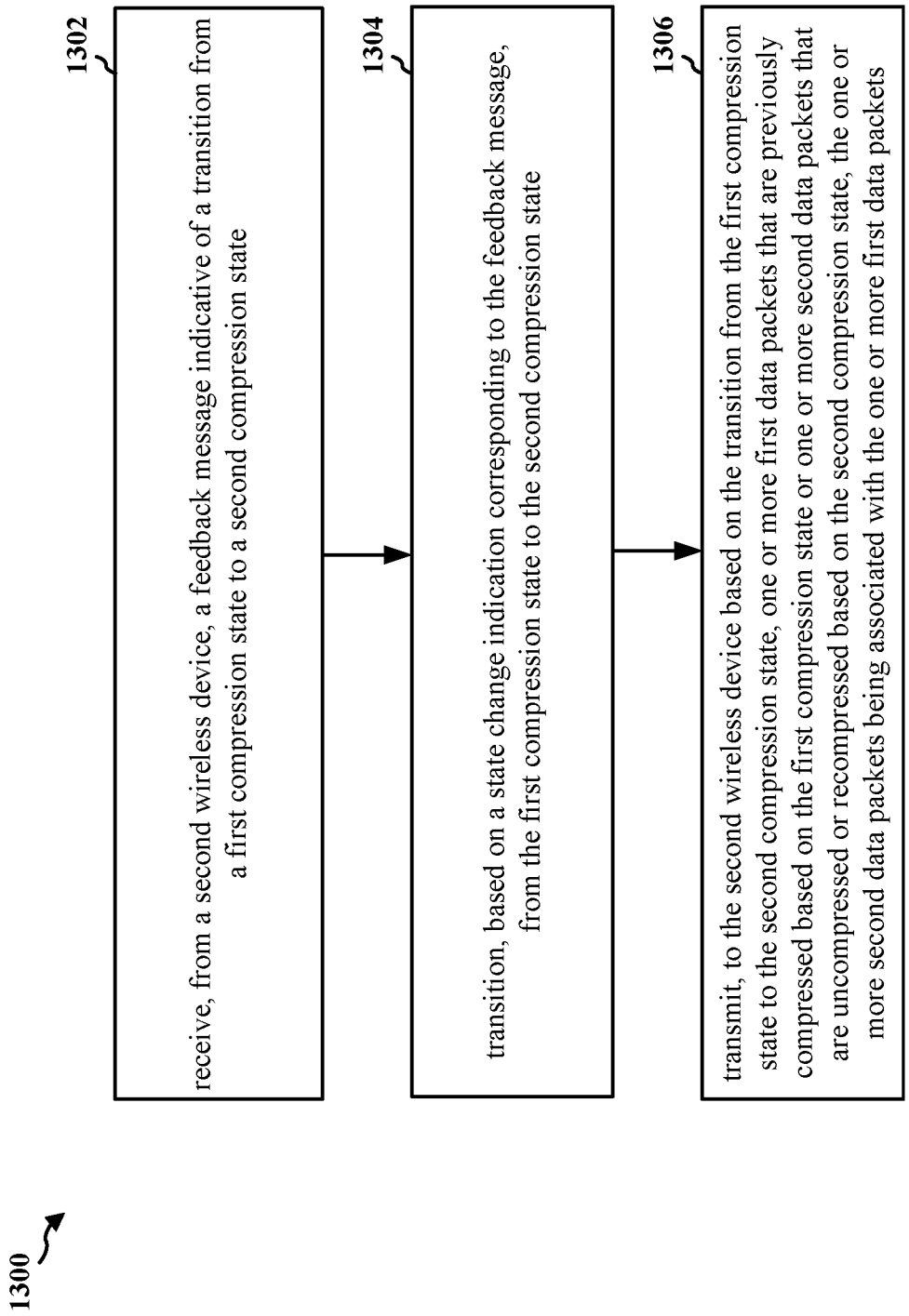
FIG. 13 is a flowchart of a method of wireless communication.

FIG. 13 is a flowchart 1300 of a method of wireless communication. The method may be performed by a first wireless device (e.g., a UE) (e.g., the UE 104/350/1202; the apparatus 1702). At 1302, the first wireless device may receive, from a second wireless device, a feedback message indicative of a transition from a first compression state to a second compression state. For example, 1302 may be performed by the compression component 1740 in FIG. 17. Referring to FIG. 12, at 1208, the first wireless device 1202 may receive, from a second wireless device 1204, a feedback message indicative of a transition from a first compression state to a second compression state.

At 1304, the first wireless device may transition, based on a state change indication corresponding to the feedback message, from the first compression state to the second compression state. For example, 1304 may be performed by the compression component 1740 in FIG. 17. Referring to FIG. 12, at 1210, the first wireless device 1202 may transition, based on a state change indication corresponding to the feedback message, from the first compression state to the second compression state.

At 1306, the first wireless device may transmit, to the second wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets. For example, 1306 may be performed by the compression component 1740 in FIG. 17. Referring to FIG. 12, at 1214, the first wireless device 1202 may transmit, to the second wireless device 1204 based on the transition from the first compression state to the second compression state, one or more first data packets that are previously compressed based on the first compression state or one or more second data packets that are uncompressed or recompressed based on the second compression state.

Figure 14:
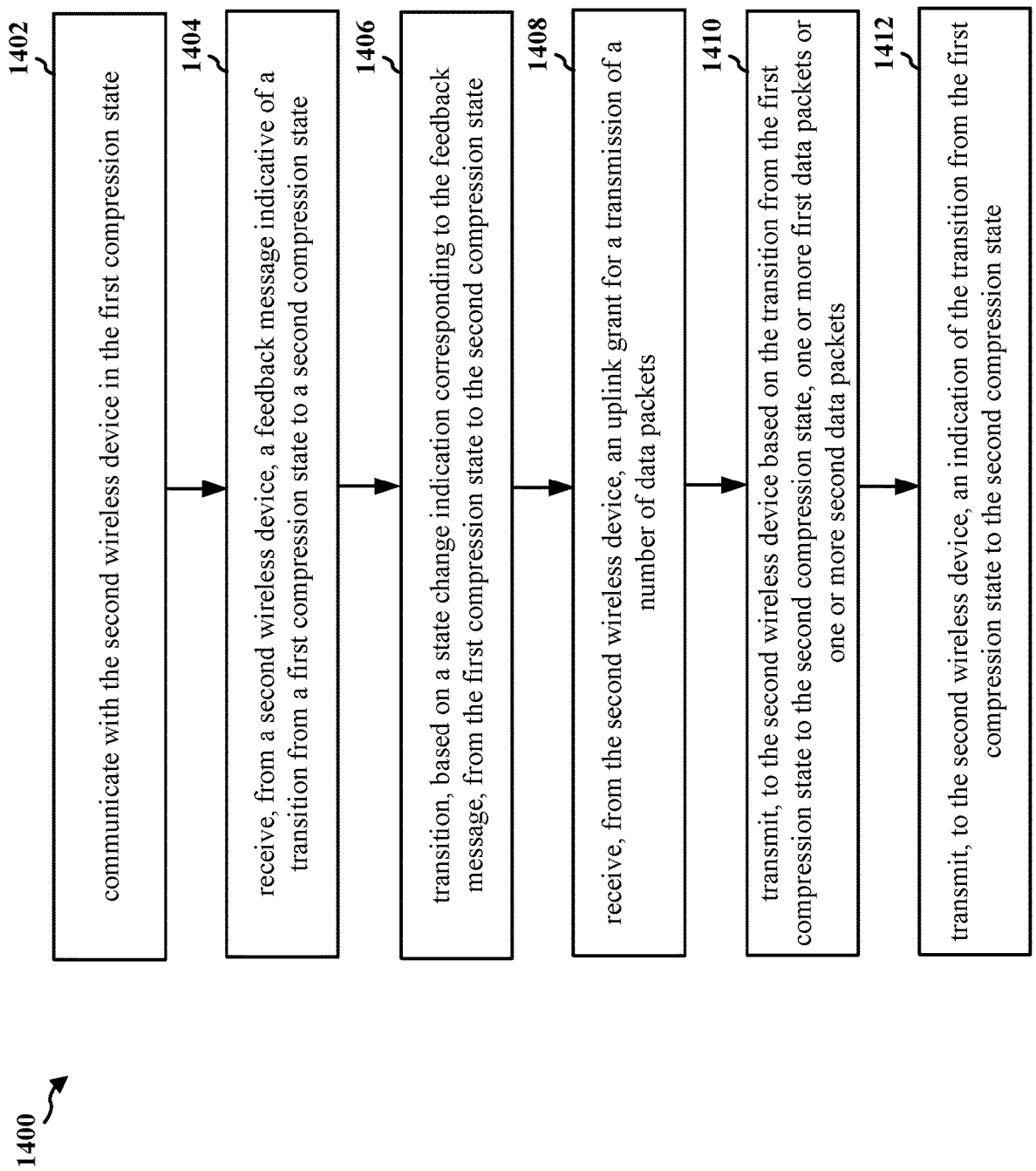
FIG. 14 is a flowchart of a method of wireless communication.

FIG. 14 is a flowchart 1400 of a method of wireless communication. The method may be performed by a UE (e.g., the UE 104/350/1202; the apparatus 1702). At 1404, the first wireless device may receive, from a second wireless device, a feedback message indicative of a transition from a first compression state to a second compression state. For example, 1404 may be performed by the compression component 1740 in FIG. 17. Referring to FIG. 12, at 1208, the first wireless device 1202 may receive, from a second wireless device 1204, a feedback message indicative of a transition from a first compression state to a second compression state.

At 1406, the first wireless device may transition, based on a state change indication corresponding to the feedback message, from the first compression state to the second compression state. For example, 1406 may be performed by the compression component 1740 in FIG. 17. Referring to FIG. 12, at 1210, the first wireless device 1202 may transition, based on a state change indication corresponding to the feedback message, from the first compression state to the second compression state.

At 1410, the first wireless device may transmit, to the second wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets. For example, 1410 may be performed by the compression component 1740 in FIG. 17. Referring to FIG. 12, at 1214, the first wireless device 1202 may transmit, to the second wireless device 1204 based on the transition from the first compression state to the second compression state, one or more first data packets that are previously compressed based on the first compression state or one or more second data packets that are uncompressed or recompressed based on the second compression state.

In one configuration, at 1402, the first wireless device may communicate with the second wireless device in the first compression state. For example, 1402 may be performed by the compression component 1740 in FIG. 17. Referring to FIG. 12, at 1206, the first wireless device 1202 may communicate with the second wireless device 1204 in the first compression state.

In one configuration, at 1412, the first wireless device may transmit, to the second wireless device, an indication of the transition from the first compression state to the second compression state. For example, 1412 may be performed by the compression component 1740 in FIG. 17. Referring to FIG. 12, at 1216, the first wireless device 1202 may transmit, to the second wireless device 1204, an indication of the transition from the first compression state to the second compression state.

In one configuration, at 1408, the first wireless device may receive, from the second wireless device, an uplink grant for a transmission of a number of data packets. For example, 1408 may be performed by the compression component 1740 in FIG. 17. Referring to FIG. 12, at 1212, the first wireless device 1202 may receive, from the second wireless device 1204, an uplink grant for a transmission of a number of data packets.

In one configuration, the one or more first data packets or the one or more second data packets may correspond to at least one of: TCP packets, UDP packets, RTP packets, or IP packets.

In one configuration, the first wireless device may be a UE and the second wireless device may be a base station.

In one configuration, the feedback message may be associated with one or more CIDs. The one or more first data packets or the one or more second data packets may correspond to buffered data packets associated with the one or more CIDs. The one or more second data packets may be transmitted to the second wireless device as data packets recompressed based on the second compression state.

In one configuration, the first compression state may be associated with a higher order than the second compression state.

In one configuration, the one or more first data packets or the one or more second data packets may correspond to an entire set of buffered data packets. The one or more second data packets may be transmitted to the second wireless device as uncompressed data packets.

In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to an entire set of buffered data packets. The one or more second data packets may be transmitted to the second wireless device as uncompressed data packets when the factor is less than a threshold, and the one or more first data packets may be transmitted to the second wireless device when the factor is greater than the threshold.

In one configuration, the feedback message may be associated with one or more CIDs. The one or more first data packets or the one or more second data packets may correspond to buffered data packets associated with the one or more CIDs. The one or more second data packets may be transmitted to the second wireless device as uncompressed data packets.

In one configuration, the second compression state may be associated with a higher order than the first compression state.

In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to a subset of buffered data packets associated with the one or more CIDs. A number of data packets in the subset may be based on the factor. The one or more second data packets may be transmitted to the second wireless device as data packets recompressed based on the second compression state when the factor is less than a threshold, and the one or more first data packets may be transmitted to the second wireless device when the factor is greater than the threshold.

Figure 15:
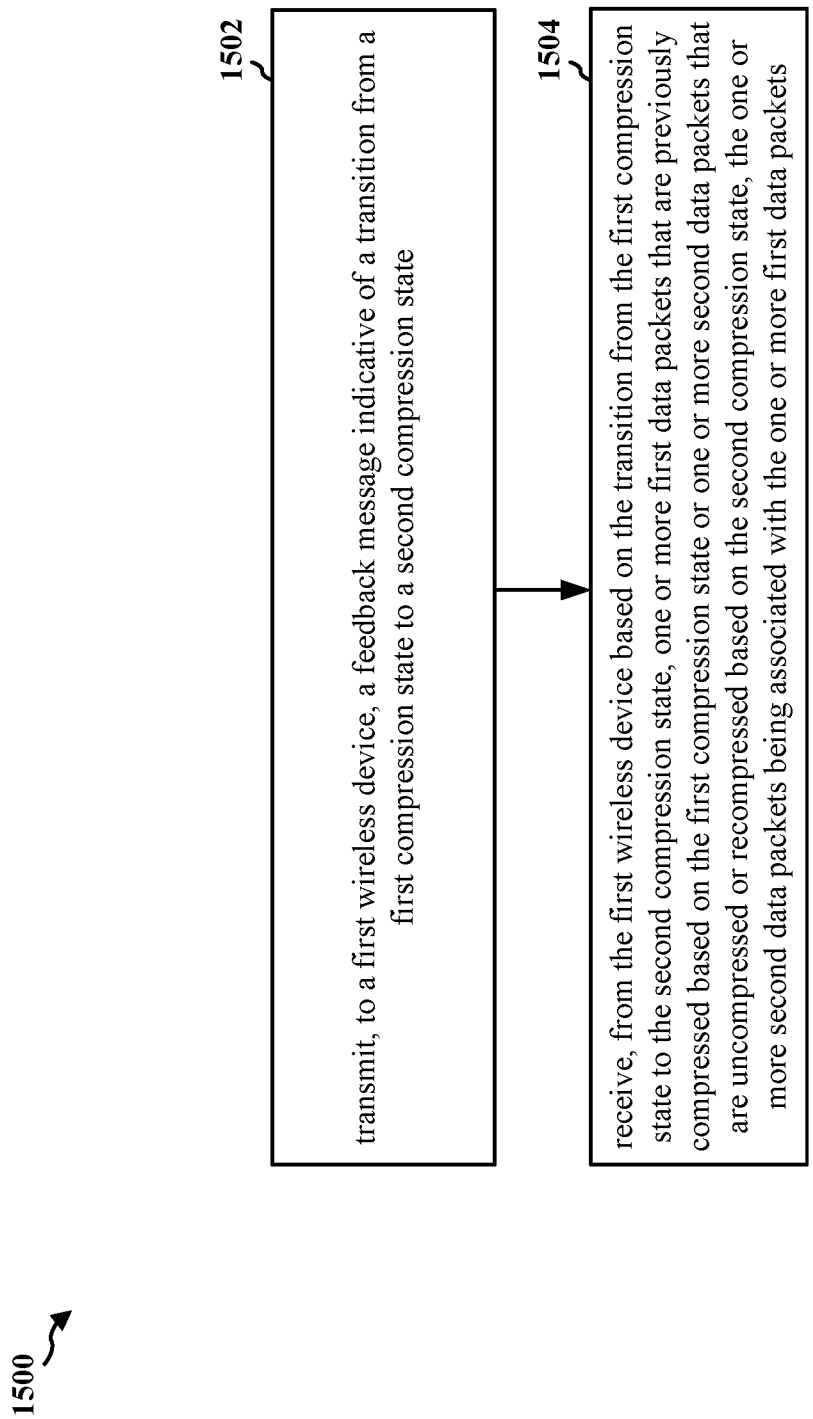
FIG. 15 is a flowchart of a method of wireless communication.

FIG. 15 is a flowchart 1500 of a method of wireless communication. The method may be performed by a second wireless device (e.g., a base station) (e.g., the base station 102/180/310/1204; the apparatus 1802). At 1502, the second wireless device may transmit, to a first wireless device, a feedback message indicative of a transition from a first compression state to a second compression state. For example, 1502 may be performed by the compression component 1840 in FIG. 18. Referring to FIG. 12, at 1208, the second wireless device 1204 may transmit, to a first wireless device 1202, a feedback message indicative of a transition from a first compression state to a second compression state.

At 1504, the second wireless device may receive, from the first wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets. For example, 1504 may be performed by the compression component 1840 in FIG. 18. Referring to FIG. 12, at 1214, the second wireless device 1204 may receive, from the first wireless device 1202 based on the transition from the first compression state to the second compression state, one or more first data packets that are previously compressed based on the first compression state or one or more second data packets that are uncompressed or recompressed based on the second compression state.

Figure 16:
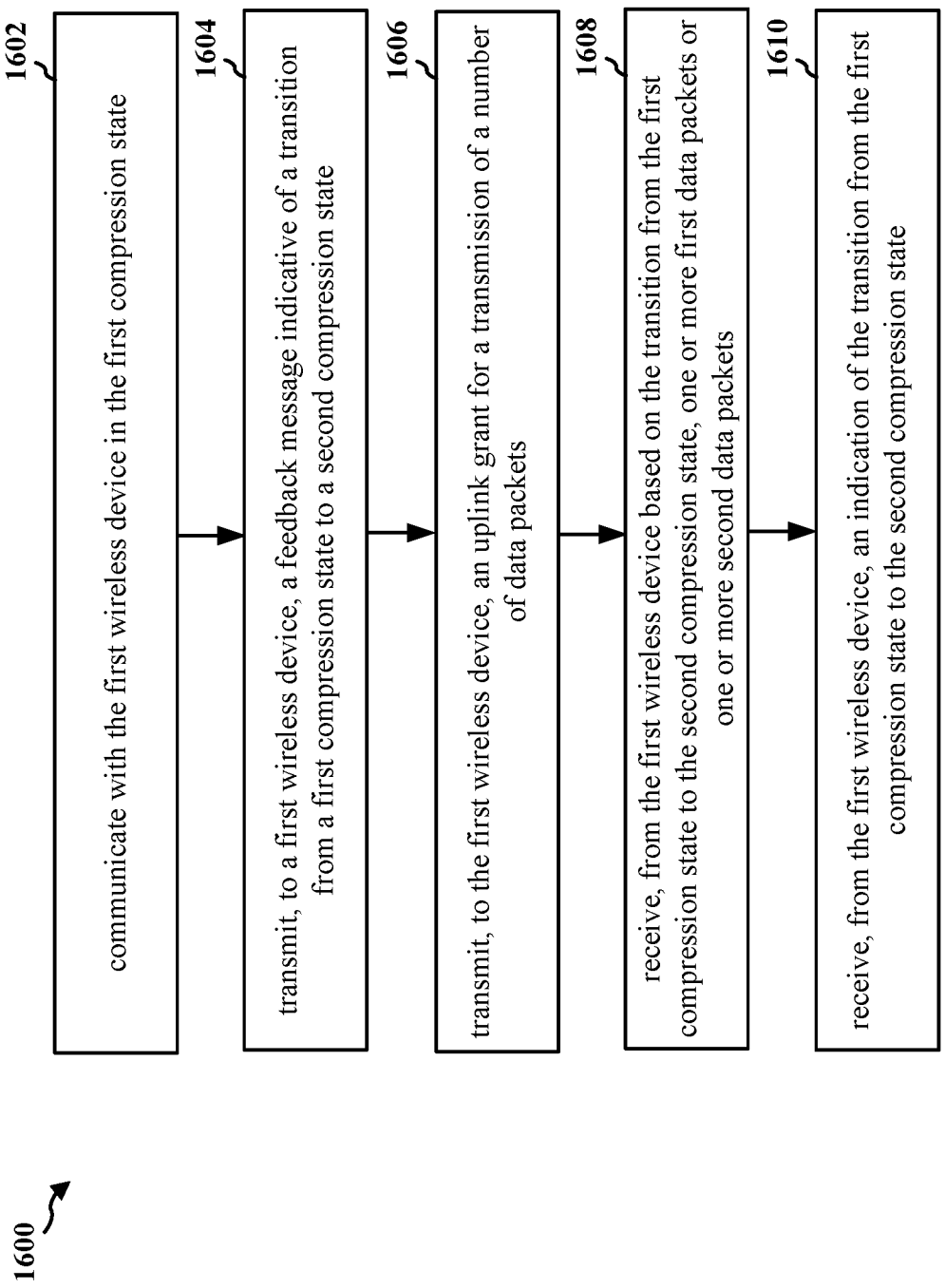
FIG. 16 is a flowchart of a method of wireless communication.

FIG. 16 is a flowchart 1600 of a method of wireless communication. The method may be performed by a second wireless device (e.g., a base station) (e.g., the base station 102/180/310/1204; the apparatus 1802). At 1604, the second wireless device may transmit, to a first wireless device, a feedback message indicative of a transition from a first compression state to a second compression state. For example, 1604 may be performed by the compression component 1840 in FIG. 18. Referring to FIG. 12, at 1208, the second wireless device 1204 may transmit, to a first wireless device 1202, a feedback message indicative of a transition from a first compression state to a second compression state.

At 1608, the second wireless device may receive, from the first wireless device based on the transition from the first compression state to the second compression state, one or more first data packets that are previously compressed based on the first compression state or one or more second data packets that are uncompressed or recompressed based on the second compression state. The one or more second data packets may be associated with the one or more first data packets. For example, 1608 may be performed by the compression component 1840 in FIG. 18. Referring to FIG. 12, at 1214, the second wireless device 1204 may receive, from the first wireless device 1202 based on the transition from the first compression state to the second compression state, one or more first data packets that are previously compressed based on the first compression state or one or more second data packets that are uncompressed or recompressed based on the second compression state.

In one configuration, at 1602, the second wireless device may communicate with the first wireless device in the first compression state. For example, 1602 may be performed by the compression component 1840 in FIG. 18. Referring to FIG. 12, at 1206, the second wireless device 1204 may communicate with the first wireless device 1202 in the first compression state.

In one configuration, at 1610, the second wireless device may receive, from the first wireless device, an indication of the transition from the first compression state to the second compression state. For example, 1610 may be performed by the compression component 1840 in FIG. 18. Referring to FIG. 12, at 1216, the second wireless device 1204 may receive, from the first wireless device 1202, an indication of the transition from the first compression state to the second compression state.

In one configuration, at 1606, the second wireless device may transmit, to the first wireless device, an uplink grant for a transmission of a number of data packets. For example, 1606 may be performed by the compression component 1840 in FIG. 18. Referring to FIG. 12, at 1212, the second wireless device 1204 may transmit, to the first wireless device 1202, an uplink grant for a transmission of a number of data packets.

In one configuration, the one or more first data packets or the one or more second data packets may correspond to at least one of: TCP packets, UDP packets, RTP packets, or IP packets.

In one configuration, the first wireless device may be a UE and the second wireless device may be a base station.

In one configuration, the feedback message may be associated with one or more CIDs. The one or more first data packets or the one or more second data packets may correspond to buffered data packets associated with the one or more CIDs. The one or more second data packets may be received from the first wireless device as data packets recompressed based on the second compression state.

In one configuration, the first compression state may be associated with a higher order than the second compression state.

In one configuration, the one or more first data packets or the one or more second data packets may correspond to an entire set of buffered data packets. The one or more second data packets may be received from the first wireless device as uncompressed data packets.

In one configuration, the feedback message may be associated with one or more CIDs. A state change indication may be associated with a factor that is based on a total number of previously compressed bytes and a number of previously compressed bytes associated with the one or more CIDs. The one or more first data packets or the one or more second data packets may correspond to an entire set of buffered data packets. The one or more second data packets may be received from the first wireless device as uncompressed data packets when the factor is less than a threshold, and the one or more first data packets may be received from the first wireless device when the factor is greater than the threshold.

In one configuration, the feedback message may be associated with one or more CIDs. The one or more first data packets or the one or more second data packets may correspond to buffered data packets associated with the one or more CIDs. The one or more second data packets may be received from the first wireless device as uncompressed data packets.

In one configuration, the second compression state may be associated with a higher order than the first compression state.

In one configuration, the feedback message may be associated with one or more CIDs. A state change indication may be associated with a factor that is based on a total number of previously compressed bytes and a number of previously compressed bytes associated with the one or more CIDs. The one or more first data packets or the one or more second data packets may correspond to a subset of buffered data packets associated with the one or more CIDs. A number of data packets in the subset may be based on the factor. The one or more second data packets may be received from the first wireless device as data packets recompressed based on the second compression state when the factor is less than a threshold, and the one or more first data packets may be received from the first wireless device when the factor is greater than the threshold.

Figure 17:
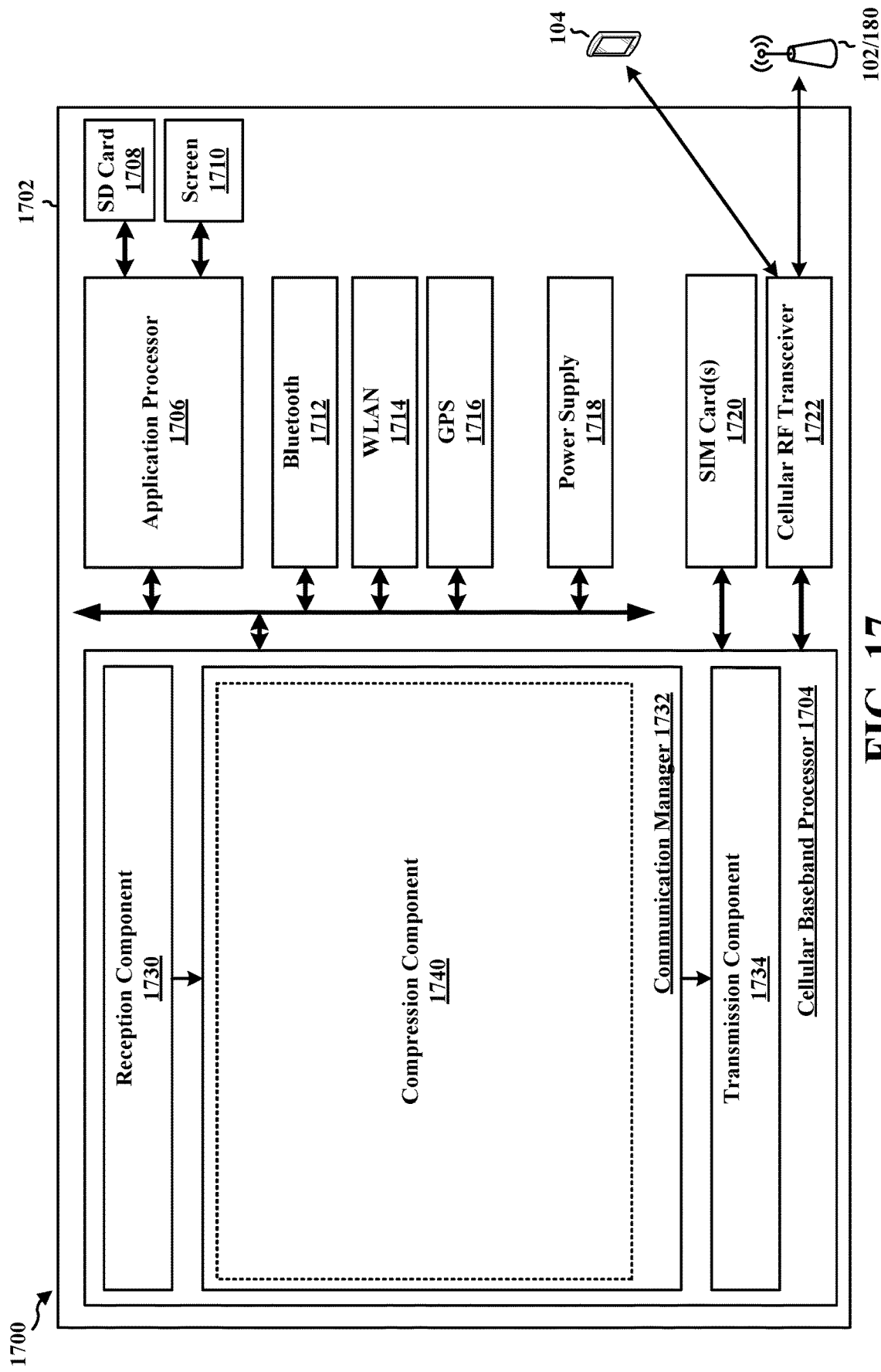
FIG. 17 is a diagram illustrating an example of a hardware implementation for an example apparatus.

FIG. 17 is a diagram 1700 illustrating an example of a hardware implementation for an apparatus 1702. The apparatus 1702 is a UE and includes a cellular baseband processor 1704 (also referred to as a modem) coupled to a cellular RF transceiver 1722 and one or more subscriber identity modules (SIM) cards 1720, an application processor 1706 coupled to a secure digital (SD) card 1708 and a screen 1710, a Bluetooth module 1712, a wireless local area network (WLAN) module 1714, a Global Positioning System (GPS) module 1716, and a power supply 1718. The cellular baseband processor 1704 communicates through the cellular RF transceiver 1722 with the UE 104 and/or BS 102/180. The cellular baseband processor 1704 may include a computer-readable medium/memory. The computer-readable medium/memory may be non-transitory. The cellular baseband processor 1704 is responsible for general processing, including the execution of software stored on the computer-readable medium/memory. The software, when executed by the cellular baseband processor 1704, causes the cellular baseband processor 1704 to perform the various functions described supra. The computer-readable medium/memory may also be used for storing data that is manipulated by the cellular baseband processor 1704 when executing software. The cellular baseband processor 1704 further includes a reception component 1730, a communication manager 1732, and a transmission component 1734. The communication manager 1732 includes the one or more illustrated components. The components within the communication manager 1732 may be stored in the computer-readable medium/memory and/or configured as hardware within the cellular baseband processor 1704. The cellular baseband processor 1704 may be a component of the UE 350 and may include the memory 360 and/or at least one of the TX processor 368, the RX processor 356, and the controller/processor 359. In one configuration, the apparatus 1702 may be a modem chip and include just the baseband processor 1704, and in another configuration, the apparatus 1702 may be the entire UE (e.g., see 350 of FIG. 3) and include the aforediscussed additional modules of the apparatus 1702.

The communication manager 1732 includes a compression component 1740 that may be configured to communicate with the second wireless device in the first compression state, e.g., as described in connection with 1402 in FIG. 14. The compression component 1740 may be further configured to receive, from a second wireless device, a feedback message indicative of a transition from a first compression state to a second compression state, e.g., as described in connection with 1302 in FIGS. 13 and 1404 in FIG. 14. The compression component 1740 may be further configured to transition, based on a state change indication corresponding to the feedback message, from the first compression state to the second compression state, e.g., as described in connection with 1304 in FIGS. 13 and 1406 in FIG. 14. The compression component 1740 may be further configured to receive, from the second wireless device, an uplink grant for a transmission of a number of data packets, e.g., as described in connection with 1408 in FIG. 14. The compression component 1740 may be further configured to transmit, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, e.g., as described in connection with 1306 in FIGS. 13 and 1410 in FIG. 14. The compression component 1740 may be further configured to transmit, to the second wireless device, an indication of the transition from the first compression state to the second compression state, e.g., as described in connection with 1412 in FIG. 14.

The apparatus may include additional components that perform each of the blocks of the algorithm in the aforementioned flowcharts of FIGS. 12-14. As such, each block in the aforementioned flowcharts of FIGS. 12-14 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1702, and in particular the cellular baseband processor 1704, includes means for receiving, from a second wireless device, a feedback message indicative of a transition from a first compression state to a second compression state. The apparatus 1702 may include means for transitioning, based on a state change indication corresponding to the feedback message, from the first compression state to the second compression state. The apparatus 1702 may include means for transmitting, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets.

In one configuration, the apparatus 1702 may further include means for communicating with the second wireless device in the first compression state. In one configuration, the apparatus 1702 may further include means for transmitting, to the second wireless device, an indication of the transition from the first compression state to the second compression state. In one configuration, the apparatus 1702 may further include means for receiving, from the second wireless device, an uplink grant for a transmission of a number of data packets. In one configuration, the one or more first data packets or the one or more second data packets may correspond to at least one of: TCP packets, UDP packets, RTP packets, or IP packets. In one configuration, the first wireless device may be a UE and the second wireless device may be a base station. In one configuration, the feedback message may be associated with one or more CIDs. The one or more first data packets or the one or more second data packets may correspond to buffered data packets associated with the one or more CIDs. The one or more second data packets may be transmitted to the second wireless device as data packets recompressed based on the second compression state. In one configuration, the first compression state may be associated with a higher order than the second compression state. In one configuration, the one or more first data packets or the one or more second data packets may correspond to an entire set of buffered data packets. The one or more second data packets may be transmitted to the second wireless device as uncompressed data packets. In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to an entire set of buffered data packets. The one or more second data packets may be transmitted to the second wireless device as uncompressed data packets when the factor is less than a threshold, and the one or more first data packets may be transmitted to the second wireless device when the factor is greater than the threshold. In one configuration, the feedback message may be associated with one or more CIDs. The one or more first data packets or the one or more second data packets may correspond to buffered data packets associated with the one or more CIDs. The one or more second data packets may be transmitted to the second wireless device as uncompressed data packets. In one configuration, the second compression state may be associated with a higher order than the first compression state. In one configuration, the feedback message may be associated with one or more CIDs. The state change indication may be associated with a factor that is based on a total number of previously compressed bytes and a number of previously compressed bytes associated with the one or more CIDs. The one or more first data packets or the one or more second data packets may correspond to a subset of buffered data packets associated with the one or more CIDs. A number of data packets in the subset may be based on the factor. The one or more second data packets may be transmitted to the second wireless device as data packets recompressed based on the second compression state when the factor is less than a threshold, and the one or more first data packets may be transmitted to the second wireless device when the factor is greater than the threshold.

The aforementioned means may be one or more of the aforementioned components of the apparatus 1702 configured to perform the functions recited by the aforementioned means. As described supra, the apparatus 1702 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 18:
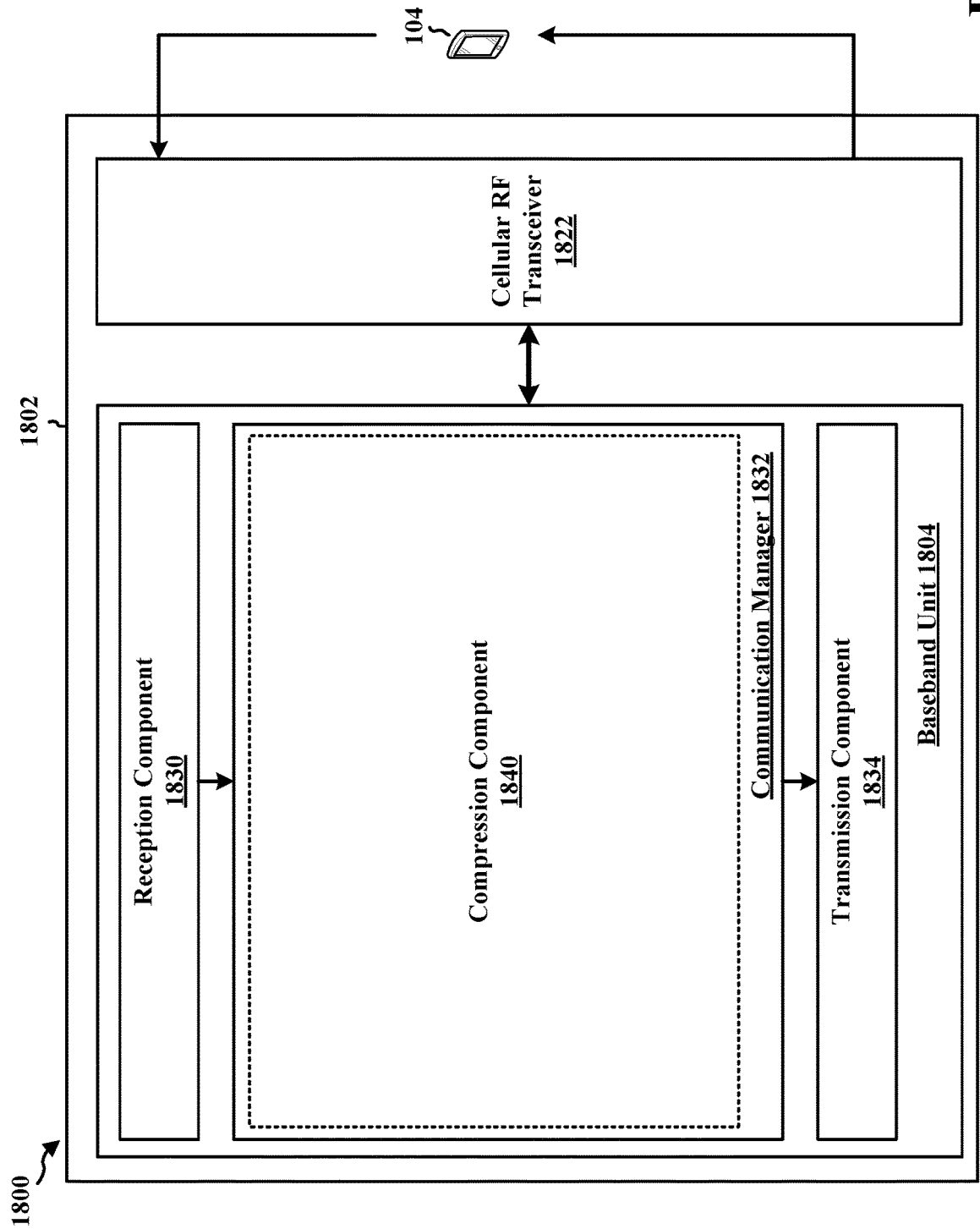
FIG. 18 is a diagram illustrating an example of a hardware implementation for an example apparatus.

FIG. 18 is a diagram 1800 illustrating an example of a hardware implementation for an apparatus 1802. The apparatus 1802 is a BS and includes a baseband unit 1804. The baseband unit 1804 may communicate through a cellular RF transceiver 1822 with the UE 104. The baseband unit 1804 may include a computer-readable medium/memory. The baseband unit 1804 is responsible for general processing, including the execution of software stored on the computer-readable medium/memory. The software, when executed by the baseband unit 1804, causes the baseband unit 1804 to perform the various functions described supra. The computer-readable medium/memory may also be used for storing data that is manipulated by the baseband unit 1804 when executing software. The baseband unit 1804 further includes a reception component 1830, a communication manager 1832, and a transmission component 1834. The communication manager 1832 includes the one or more illustrated components. The components within the communication manager 1832 may be stored in the computer-readable medium/memory and/or configured as hardware within the baseband unit 1804. The baseband unit 1804 may be a component of the BS 310 and may include the memory 376 and/or at least one of the TX processor 316, the RX processor 370, and the controller/processor 375.

The communication manager 1832 includes a compression component 1840 that may be configured to communicate with the first wireless device in the first compression state, e.g., as described in connection with 1602 in FIG. 16. The compression component 1840 may be further configured to transmit, to a first wireless device, a feedback message indicative of a transition from a first compression state to a second compression state, e.g., as described in connection with 1502 in FIGS. 15 and 1604 in FIG. 16. The compression component 1840 may be further configured to transmit, to the first wireless device, an uplink grant for a transmission of a number of data packets, e.g., as described in connection with 1606 in FIG. 16. The compression component 1840 may be further configured to receive, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, e.g., as described in connection with 1504 in FIGS. 15 and 1608 in FIG. 16. The compression component 1840 may be further configured to receive, from the first wireless device, an indication of the transition from the first compression state to the second compression state, e.g., as described in connection with 1610 in FIG. 16.

The apparatus may include additional components that perform each of the blocks of the algorithm in the aforementioned flowcharts of FIGS. 12, 15, and 16. As such, each block in the aforementioned flowcharts of FIGS. 12, 15, and 16 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1802, and in particular the baseband unit 1804, includes means for transmitting, to a first wireless device, a feedback message indicative of a transition from a first compression state to a second compression state. The apparatus 1802 may include means for receiving, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets.

In one configuration, the apparatus 1802 may further include means for communicating with the first wireless device in the first compression state. In one configuration, the apparatus 1802 may further include means for receiving, from the first wireless device, an indication of the transition from the first compression state to the second compression state. In one configuration, the apparatus 1802 may further include means for transmitting, to the first wireless device, an uplink grant for a transmission of a number of data packets. In one configuration, the one or more first data packets or the one or more second data packets may correspond to at least one of: TCP packets, UDP packets, RTP packets, or IP packets. In one configuration, the first wireless device may be a UE and the second wireless device may be a base station. In one configuration, the feedback message may be associated with one or more CIDs. The one or more first data packets or the one or more second data packets may correspond to buffered data packets associated with the one or more CIDs. The one or more second data packets may be received from the first wireless device as data packets recompressed based on the second compression state. In one configuration, the first compression state may be associated with a higher order than the second compression state. In one configuration, the one or more first data packets or the one or more second data packets may correspond to an entire set of buffered data packets. The one or more second data packets may be received from the first wireless device as uncompressed data packets. In one configuration, the feedback message may be associated with one or more CIDs. A state change indication may be associated with a factor that is based on a total number of previously compressed bytes and a number of previously compressed bytes associated with the one or more CIDs. The one or more first data packets or the one or more second data packets may correspond to an entire set of buffered data packets. The one or more second data packets may be received from the first wireless device as uncompressed data packets when the factor is less than a threshold, and the one or more first data packets may be received from the first wireless device when the factor is greater than the threshold. In one configuration, the feedback message may be associated with one or more CIDs. The one or more first data packets or the one or more second data packets may correspond to buffered data packets associated with the one or more CIDs. The one or more second data packets may be received from the first wireless device as uncompressed data packets. In one configuration, the second compression state may be associated with a higher order than the first compression state. In one configuration, the feedback message may be associated with one or more CIDs. A state change indication may be associated with a factor that is based on a total number of previously compressed bytes and a number of previously compressed bytes associated with the one or more CIDs. The one or more first data packets or the one or more second data packets may correspond to a subset of buffered data packets associated with the one or more CIDs. A number of data packets in the subset may be based on the factor. The one or more second data packets may be received from the first wireless device as data packets recompressed based on the second compression state when the factor is less than a threshold, and the one or more first data packets may be received from the first wireless device when the factor is greater than the threshold.

The aforementioned means may be one or more of the aforementioned components of the apparatus 1802 configured to perform the functions recited by the aforementioned means. As described supra, the apparatus 1802 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

The second wireless device may transmit, to the first wireless device, a feedback message indicative of a transition from a first compression state to a second compression state. The first wireless device may transition, based on a state change indication corresponding to the feedback message, from the first compression state to the second compression state. The first wireless device may transmit, to the second wireless device based on the transition from the first compression state to the second compression state, one or more first data packets that are previously compressed based on the first compression state or one or more second data packets that are uncompressed or recompressed based on the second compression state. The one or more second data packets being associated with the one or more first data packets. Accordingly, the decoding failure may be avoided when a compression bearer is transitioned from a higher order compression state to a lower order compression state, and the compression efficiency may be improved when the compression bearer is transitioned from a lower order compression state to a higher order compression state. Different aspects may be associated with different performance profiles including different compression efficiencies, different bandwidth resource utilizations, and/or different transmit power savings.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is a method of wireless communication at a first wireless device, including: receiving, from a second wireless device, a feedback message indicative of a transition from a first compression state to a second compression state; transitioning, based on a state change indication corresponding to the feedback message, from the first compression state to the second compression state; and transmitting, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets.

Aspect 2 is the method of aspect 1, further including: communicating with the second wireless device in the first compression state.

Aspect 3 is the method of any of aspects 1 and 2, further including: transmitting, to the second wireless device, an indication of the transition from the first compression state to the second compression state.

Aspect 4 is the method of any of aspects 1 to 3, further including: receiving, from the second wireless device, an uplink grant for a transmission of a number of data packets.

Aspect 5 is the method of any of aspects 1 to 4, where the one or more first data packets or the one or more second data packets correspond to at least one of: TCP packets, UDP packets, RTP packets, or IP packets.

Aspect 6 is the method of any of aspects 1 to 5, where the first wireless device is a UE and the second wireless device is a base station.

Aspect 7 is the method of any of aspects 1 to 6, where the feedback message is associated with one or more CIDs, where the one or more first data packets or the one or more second data packets correspond to buffered data packets associated with the one or more CIDs, where the one or more second data packets are transmitted to the second wireless device as data packets recompressed based on the second compression state.

Aspect 8 is the method of any of aspects 1 to 6, where the first compression state is associated with a higher order than the second compression state.

Aspect 9 is the method of aspect 8, where the one or more first data packets or the one or more second data packets correspond to an entire set of buffered data packets, where the one or more second data packets are transmitted to the second wireless device as uncompressed data packets.

Aspect 10 is the method of aspect 8, where the feedback message is associated with one or more CIDs, the state change indication is associated with a factor that is based on a total number of previously compressed bytes and a number of previously compressed bytes associated with the one or more CIDs, where the one or more first data packets or the one or more second data packets correspond to an entire set of buffered data packets, where the one or more second data packets are transmitted to the second wireless device as uncompressed data packets when the factor is less than a threshold, and the one or more first data packets are transmitted to the second wireless device when the factor is greater than the threshold.

Aspect 11 is the method of aspect 8, where the feedback message is associated with one or more CIDs, where the one or more first data packets or the one or more second data packets correspond to buffered data packets associated with the one or more CIDs, where the one or more second data packets are transmitted to the second wireless device as uncompressed data packets.

Aspect 12 is the method of any of aspects 1 to 6, where the second compression state is associated with a higher order than the first compression state.

Aspect 13 is the method of aspect 12, where the feedback message is associated with one or more CIDs, the state change indication is associated with a factor that is based on a total number of previously compressed bytes and a number of previously compressed bytes associated with the one or more CIDs, where the one or more first data packets or the one or more second data packets correspond to a subset of buffered data packets associated with the one or more CIDs, a number of data packets in the subset being based on the factor, where the one or more second data packets are transmitted to the second wireless device as data packets recompressed based on the second compression state when the factor is less than a threshold, and the one or more first data packets are transmitted to the second wireless device when the factor is greater than the threshold.

Aspect 14 is a method of wireless communication at a second wireless device, including: transmitting, to a first wireless device, a feedback message indicative of a transition from a first compression state to a second compression state; and receiving, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets.

Aspect 15 is the method of aspect 14, further including: communicating with the first wireless device in the first compression state.

Aspect 16 is the method of any of aspects 14 and 15, further including: receiving, from the first wireless device, an indication of the transition from the first compression state to the second compression state.

Aspect 17 is the method of any of aspects 14 to 16, further including: transmitting, to the first wireless device, an uplink grant for a transmission of a number of data packets.

Aspect 18 is the method of any of aspects 14 to 17, where the one or more first data packets or the one or more second data packets correspond to at least one of: TCP packets, UDP packets, RTP packets, or IP packets.

Aspect 19 is the method of any of aspects 14 to 18, where the first wireless device is a UE and the second wireless device is a base station.

Aspect 20 is the method of any of aspects 14 to 19, where the feedback message is associated with one or more CIDs, where the one or more first data packets or the one or more second data packets correspond to buffered data packets associated with the one or more CIDs, where the one or more second data packets are received from the first wireless device as data packets recompressed based on the second compression state.

Aspect 21 is the method of any of aspects 14 to 19, where the first compression state is associated with a higher order than the second compression state.

Aspect 22 is the method of aspect 21, where the one or more first data packets or the one or more second data packets correspond to an entire set of buffered data packets, where the one or more second data packets are received from the first wireless device as uncompressed data packets.

Aspect 23 is the method of aspect 21, where the feedback message is associated with one or more CIDs, a state change indication is associated with a factor that is based on a total number of previously compressed bytes and a number of previously compressed bytes associated with the one or more CIDs, where the one or more first data packets or the one or more second data packets correspond to an entire set of buffered data packets, where the one or more second data packets are received from the first wireless device as uncompressed data packets when the factor is less than a threshold, and the one or more first data packets are received from the first wireless device when the factor is greater than the threshold.

Aspect 24 is the method of aspect 21, where the feedback message is associated with one or more CIDs, where the one or more first data packets or the one or more second data packets correspond to buffered data packets associated with the one or more CIDs, where the one or more second data packets are received from the first wireless device as uncompressed data packets.

Aspect 25 is the method of any of aspects 14 to 19, where the second compression state is associated with a higher order than the first compression state.

Aspect 26 is the method of aspect 25, where the feedback message is associated with one or more CIDs, a state change indication is associated with a factor that is based on a total number of previously compressed bytes and a number of previously compressed bytes associated with the one or more CIDs, where the one or more first data packets or the one or more second data packets correspond to a subset of buffered data packets associated with the one or more CIDs, a number of data packets in the subset being based on the factor, where the one or more second data packets received from the first wireless device as data packets recompressed based on the second compression state when the factor is less than a threshold, and the one or more first data packets are received from the first wireless device when the factor is greater than the threshold.

Aspect 27 is an apparatus for wireless communication including at least one processor coupled to a memory and configured to implement a method as in any of aspects 1 to 26.

Aspect 28 is the apparatus of aspect 27, further including a transceiver coupled to the at least one processor.

Aspect 29 is an apparatus for wireless communication including means for implementing a method as in any of aspects 1 to 26.

Aspect 30 is a computer-readable medium storing computer executable code, where the code when executed by a processor causes the processor to implement a method as in any of aspects 1 to 26.

What is claimed is:

1. An apparatus for wireless communication at a first wireless device, comprising:
   memory; and
   at least one processor coupled to the memory and configured to:
      receive, from a second wireless device, a feedback message indicative of a transition from a first compression state to a second compression state;
      transition, based on a state change indication corresponding to the feedback message, from the first compression state to the second compression state, wherein a set of data packets buffered in the memory is compressed based on the first compression state; and
      transmit, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, wherein information in the set of data packets corresponds to information in the one or more first data packets or the one or more second data packets, wherein the state change indication is associated with a factor that is based on a total number of previously compressed bytes.

2. The apparatus of claim 1, the at least one processor being further configured to:
   communicate with the second wireless device in the first compression state.

3. The apparatus of claim 1, the at least one processor being further configured to:
   transmit, to the second wireless device, an indication of the transition from the first compression state to the second compression state.

4. The apparatus of claim 1, the at least one processor being further configured to:
   receive, from the second wireless device, an uplink grant for a transmission of a number of data packets.

5. The apparatus of claim 1, wherein the one or more first data packets or the one or more second data packets correspond to at least one of: transmission control protocol (TCP) packets, user datagram protocol (UDP) packets, real-time transport protocol (RTP) packets, or internet protocol (IP) packets.

6. The apparatus of claim 1, wherein the first wireless device is a user equipment (UE) and the second wireless device is a base station.

7. The apparatus of claim 1, wherein the feedback message is associated with one or more context identifiers (CIDs), wherein the one or more first data packets or the one or more second data packets correspond to buffered data packets associated with the one or more CIDs, wherein the one or more second data packets are transmitted to the second wireless device as data packets recompressed based on the second compression state.

8. The apparatus of claim 1, wherein the first compression state is associated with a higher order than the second compression state.

9. The apparatus of claim 8, wherein the one or more first data packets or the one or more second data packets correspond to an entire set of buffered data packets, wherein the one or more second data packets are transmitted to the second wireless device as uncompressed data packets.

10. The apparatus of claim 8, wherein the feedback message is associated with one or more context identifiers (CIDs), the state change indication is associated with the factor that is based on the total number of previously compressed bytes and a number of previously compressed bytes associated with the one or more CIDs, wherein the one or more first data packets or the one or more second data packets correspond to an entire set of buffered data packets, wherein the one or more second data packets are transmitted to the second wireless device as uncompressed data packets when the factor is less than a threshold, and the one or more first data packets are transmitted to the second wireless device in an unaltered state when the factor is greater than the threshold.

11. The apparatus of claim 8, wherein the feedback message is associated with one or more context identifiers (CIDs), wherein the one or more first data packets or the one or more second data packets correspond to buffered data packets associated with the one or more CIDs, wherein the one or more second data packets are transmitted to the second wireless device as uncompressed data packets.

12. The apparatus of claim 1, wherein the second compression state is associated with a higher order than the first compression state.

13. The apparatus of claim 12, wherein the feedback message is associated with one or more context identifiers (CIDs), the state change indication is associated with the factor that is based on the total number of previously compressed bytes and a number of previously compressed bytes associated with the one or more CIDs, wherein the one or more first data packets or the one or more second data packets correspond to a subset of buffered data packets associated with the one or more CIDs, a number of data packets in the subset being based on the factor, wherein the one or more second data packets are transmitted to the second wireless device as data packets recompressed based on the second compression state when the factor is less than a threshold, and the one or more first data packets are transmitted to the second wireless device in an unaltered state when the factor is greater than the threshold.

14. The apparatus of claim 1, further comprising a transceiver coupled to the at least one processor.

15. A method of wireless communication at a first wireless device, comprising:
receiving, from a second wireless device, a feedback message indicative of a transition from a first compression state to a second compression state;
transitioning, based on a state change indication corresponding to the feedback message, from the first compression state to the second compression state, wherein a set of data packets buffered in memory is compressed based on the first compression state; and
transmitting, to the second wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, wherein information in the set of data packets corresponds to information in the one or more first data packets or the one or more second data packets, wherein the state change indication is associated with a factor that is based on a total number of previously compressed bytes.

16. An apparatus for wireless communication at a second wireless device, comprising:
memory; and
at least one processor coupled to the memory and configured to:
transmit, to a first wireless device, a feedback message indicative of a transition from a first compression state to a second compression state, wherein a set of data packets is compressed based on the first compression state; and
receive, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, wherein information in the set of data packets corresponds to information in the one or more first data packets or the one or more second data packets, wherein a state change indication associated with the first compression state or the second compression state is associated with a factor that is based on a total number of previously compressed bytes.

17. The apparatus of claim 16, the at least one processor being further configured to:
communicate with the first wireless device in the first compression state.

18. The apparatus of claim 16, the at least one processor being further configured to:
receive, from the first wireless device, an indication of the transition from the first compression state to the second compression state.

19. The apparatus of claim 16, the at least one processor being further configured to:
transmit, to the first wireless device, an uplink grant for a transmission of a number of data packets.

20. The apparatus of claim 16, wherein the one or more first data packets or the one or more second data packets correspond to at least one of: transmission control protocol (TCP) packets, user datagram protocol (UDP) packets, real-time transport protocol (RTP) packets, or internet protocol (IP) packets.

21. The apparatus of claim 16, wherein the first wireless device is a user equipment (UE) and the second wireless device is a base station.

22. The apparatus of claim 16, wherein the feedback message is associated with one or more context identifiers (CIDs), wherein the one or more first data packets or the one or more second data packets correspond to buffered data packets associated with the one or more CIDs, wherein the one or more second data packets are received from the first wireless device as data packets recompressed based on the second compression state.

23. The apparatus of claim 16, wherein the first compression state is associated with a higher order than the second compression state.

24. The apparatus of claim 23, wherein the one or more first data packets or the one or more second data packets correspond to an entire set of buffered data packets, wherein the one or more second data packets are received from the first wireless device as uncompressed data packets.

25. The apparatus of claim 23, wherein the feedback message is associated with one or more context identifiers (CIDs), the state change indication is associated with the factor that is based on the total number of previously compressed bytes and a number of previously compressed bytes associated with the one or more CIDs, wherein the one or more first data packets or the one or more second data packets correspond to an entire set of buffered data packets, wherein the one or more second data packets are received from the first wireless device as uncompressed data packets when the factor is less than a threshold, and the one or more first data packets are received from the first wireless device in an unaltered state when the factor is greater than the threshold.

26. The apparatus of claim 23, wherein the feedback message is associated with one or more context identifiers (CIDs), wherein the one or more first data packets or the one or more second data packets correspond to buffered data packets associated with the one or more CIDs, wherein the one or more second data packets are received from the first wireless device as uncompressed data packets.

27. The apparatus of claim 16, wherein the second compression state is associated with a higher order than the first compression state.

28. The apparatus of claim 27, wherein the feedback message is associated with one or more context identifiers (CIDs), the state change indication is associated with the factor that is based on the total number of previously compressed bytes and a number of previously compressed bytes associated with the one or more CIDs, wherein the one or more first data packets or the one or more second data packets correspond to a subset of buffered data packets associated with the one or more CIDs, a number of data packets in the subset being based on the factor, wherein the one or more second data packets received from the first wireless device as data packets recompressed based on the second compression state when the factor is less than a threshold, and the one or more first data packets are received from the first wireless device in an unaltered state when the factor is greater than the threshold.

29. The apparatus of claim 16, further comprising a transceiver coupled to the at least one processor.

30. A method of wireless communication at a second wireless device, comprising:
  transmitting, to a first wireless device, a feedback message indicative of a transition from a first compression state to a second compression state, wherein a set of data packets is compressed based on the first compression state; and
  receiving, from the first wireless device based on the transition from the first compression state to the second compression state, one or more first data packets that are previously compressed based on the first compression state or one or more second data packets that are uncompressed or recompressed based on the second compression state, the one or more second data packets being associated with the one or more first data packets, wherein information in the set of data packets corresponds to information in the one or more first data packets or the one or more second data packets, wherein a state change indication associated with the first compression state or the second compression state is associated with a factor that is based on a total number of previously compressed bytes.

* * * * *